(12) United States Patent
Rehwald

(10) Patent No.: US 9,442,174 B2
(45) Date of Patent: Sep. 13, 2016

(54) USING SINGLE CONTINUOUS PULSES FOR MANIPULATING WATER AND FAT SIGNALS IN MAGNETIC RESONANCE IMAGING

(71) Applicant: Wolfgang G Rehwald, Chapel Hill, NC (US)

(72) Inventor: Wolfgang G Rehwald, Chapel Hill, NC (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 579 days.

(21) Appl. No.: 14/040,944

(22) Filed: Sep. 30, 2013

(65) Prior Publication Data

US 2014/0103923 A1 Apr. 17, 2014

Related U.S. Application Data

(60) Provisional application No. 61/712,384, filed on Oct. 11, 2012.

(51) Int. Cl.
*G01R 33/48* (2006.01)
*G01R 33/56* (2006.01)

(52) U.S. Cl.
CPC ....... *G01R 33/4828* (2013.01); *G01R 33/5607* (2013.01)

(58) Field of Classification Search
CPC ............... G01R 33/4825; G01R 33/5607
See application file for complete search history.

(56) References Cited

U.S. PATENT DOCUMENTS

| | | | |
|---|---|---|---|
| 5,909,119 A | 6/1999 | Zhang | |
| 6,285,900 B1 * | 9/2001 | Stuber | G01R 33/56341 324/306 |
| 7,375,520 B2 * | 5/2008 | Nezafat | G01R 33/5635 324/307 |
| 9,078,589 B2 * | 7/2015 | Kassai | A61B 5/055 |
| 2010/0260397 A1 | 10/2010 | Block et al. | |

OTHER PUBLICATIONS

Thomasson, Purdy, Finn, "Phase-Modulated Binomial RF Pulses for Fast Spectrally-Selective Musculoskeletal Imaging", Magnetic Resonance in Medicine 35, 563-568 (1996).
Hardy, Recht, Piraino, "Fat Suppressed MRI of Articular Cartilage With a Spatial-Spectral Excitation Pulse", Journal of Magnetic Resonance Imaging 8:1279-1287 (1998).
Zuehlsdorff, Chung, Wu, Carr, Simonetti, "Fat Suppressed Delayed Enhancement Imaging", Proceedings of the ISMRM 2006.

(Continued)

*Primary Examiner* — Gregory H Curran

(57) ABSTRACT

A method for manipulating magnetic resonance signals of a first chemical species and a second chemical species includes determining a time required to have spins of protons corresponding to the first chemical species acquire a phase shift of 90 degrees relative to spins of protons corresponding to second chemical species. A first pulse portion having a pulse amplitude and a first constant phase is defined. A second pulse portion having the pulse amplitude and a second constant phase, the second constant phase being different from said first constant phase by a multiple of 90 degrees is also defined. Next, a single continuous composite pulse is generated by concatenating the first pulse portion and the second pulse portion, wherein the single continuous composite pulse has a duration such that a time difference between center of the first pulse portion and center of the second pulse portion corresponds to the determined time. Then, the single continuous composite pulse is applied to a plurality of radio frequency coils.

20 Claims, 21 Drawing Sheets

(56) References Cited

OTHER PUBLICATIONS

Lim, Byun, "Three-Dimension Magnetic Resonance Lumbosacral Radiculography by Principles of the Selective Excitation Technique Imaging in the Diagnosis of Symptomatic Foraminal Stenosis", J Korean Soc Radiology; 66 (6):551-558 (2012).

Lauenstein, "Evaluation of Optimized Inversion-Recovery Fat-Suppression Techniques for T2-Weighted Abdominal MR Imaging", Journal of Magnetic Resonance Imaging 27: 1448-1454 (2008).

M. Niitsu, E. Tohno, Y. Itai, "Fat Suppression Strategies in Enhanced MR Imaging of the Breast: Comparison of SPIR and Water Excitation Sequences", Journal of Magnetic Resonance Imaging, 18:310-314 (2003).

E. Kaldoudi et al., "A Chemical Shift Selective Inversion Recovery Sequence for Fat-Suppressed MRI: Theory and Experimental Validation", Magnetic Resonance Imaging, 11, 341-355 (1993).

Haase et al., "1H NMR Chemical Shift Selective (CHESS) Imaging", Phys. in Med. & Biol. 30, 341 (1985).

Dixon, "Simple Proton Spectroscopic Imaging", Radiology; 153: 189-194 (1984).

Glover, Schneider, "Three-Point Dixon Technique for True Water/Fat Decomposition with Bo Inhomogeneity Correction", Magnetic Resonance in Medicine 18, 371-383 (1991).

Hernando et al., "Joint Estimation of Water/Fat Images and Field Inhomogeneity Map", Magnetic Resonance in Medicine 59: 571-580 (2008).

Bley et al., "Fat and Water Magnetic Resonance Imaging", J. Magn. Reson, Imaging 31:4-18 (2010).

Meyer et al., "Simultaneous Spatial and Spectral Selective Excitation"Magnetic Resonance in Medicine 15, 287-304 (1990).

Hore, "Solvent Suppression in Fourier Transform Nuclear Magnetic Resonance", Journal of Magnetic Resonance 55, 283-300 (1983).

Sklenar, "1-2-1 Pulse Train: A New Effective Method of Selective Excitation for Proton NMR in Water", Journal of Magnetic Resonance 50, 495-50 1 (1982).

\* cited by examiner

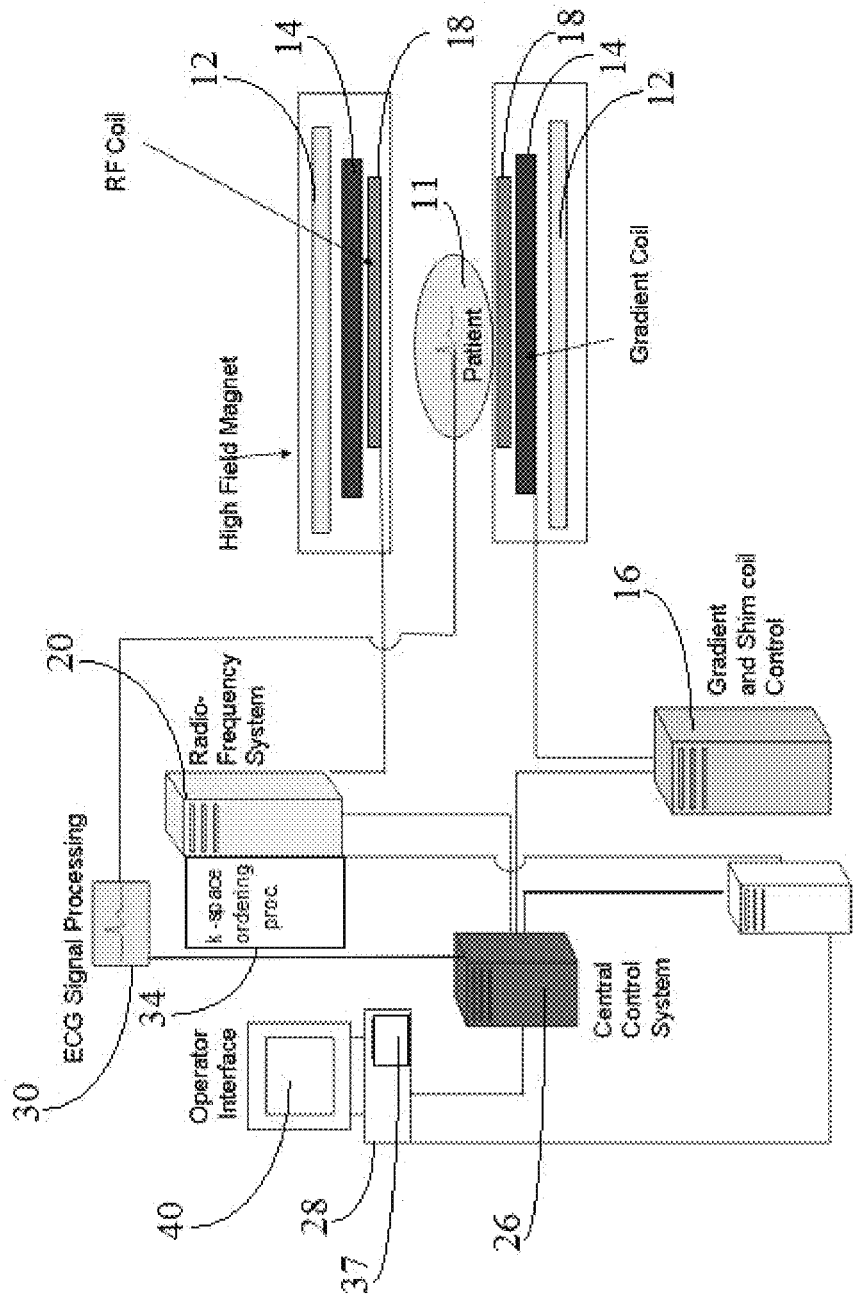

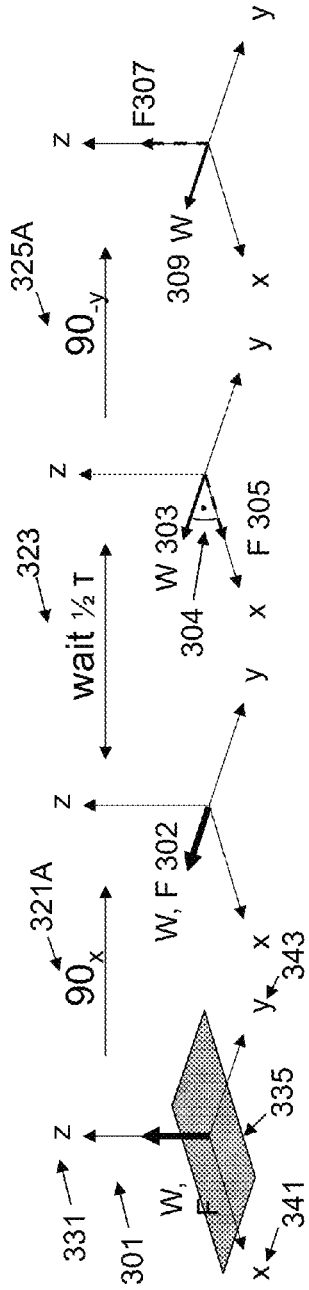
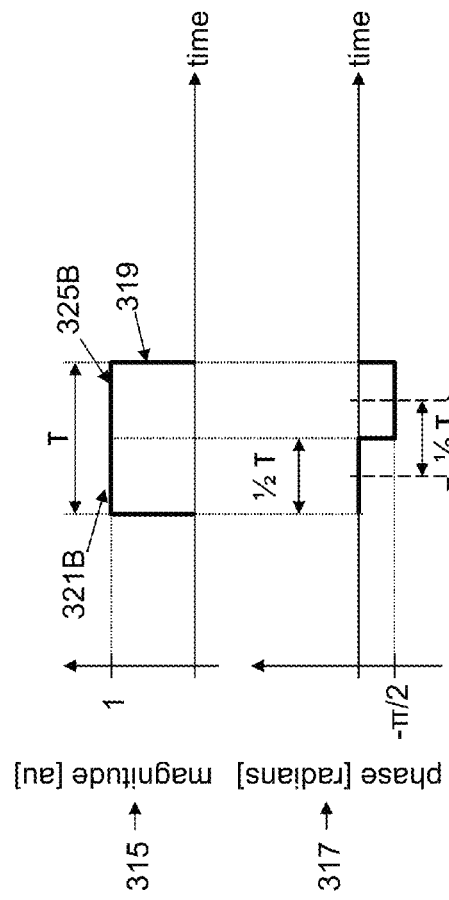
FIG. 3A
FIG. 3B

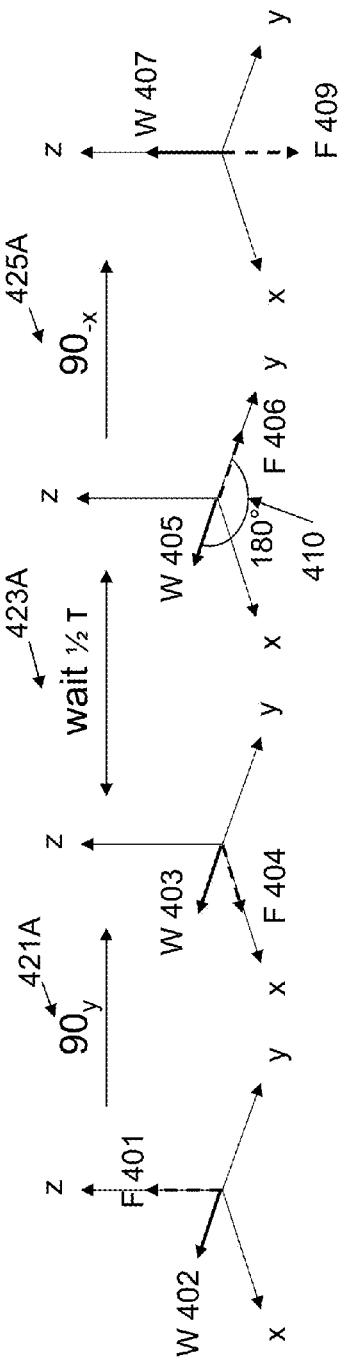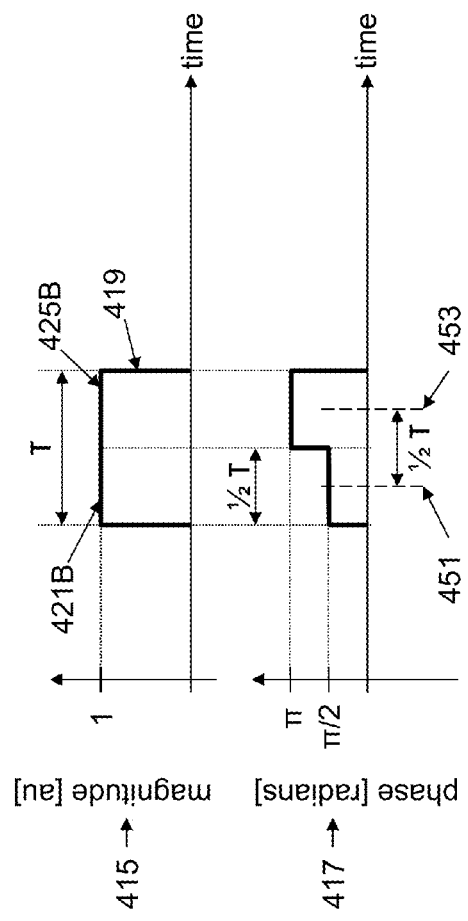
FIG. 4A
FIG. 4B

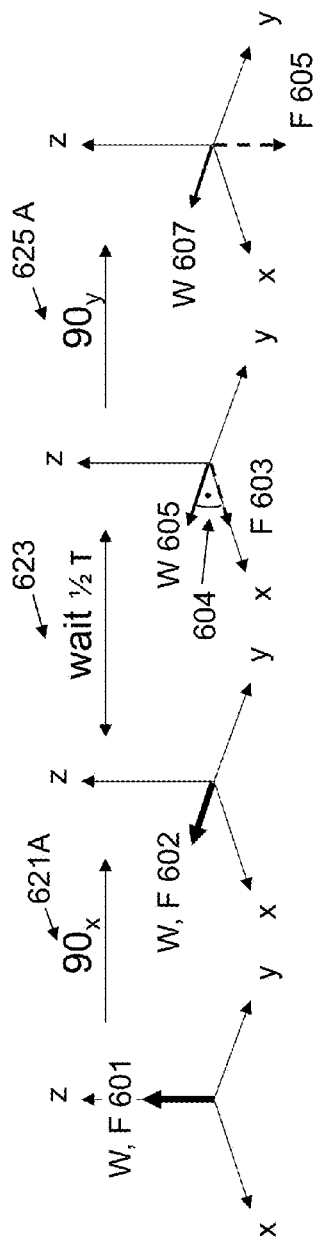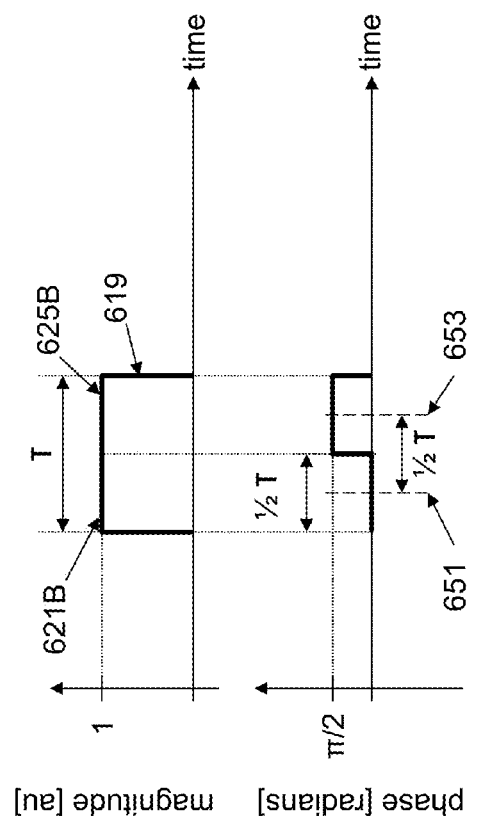

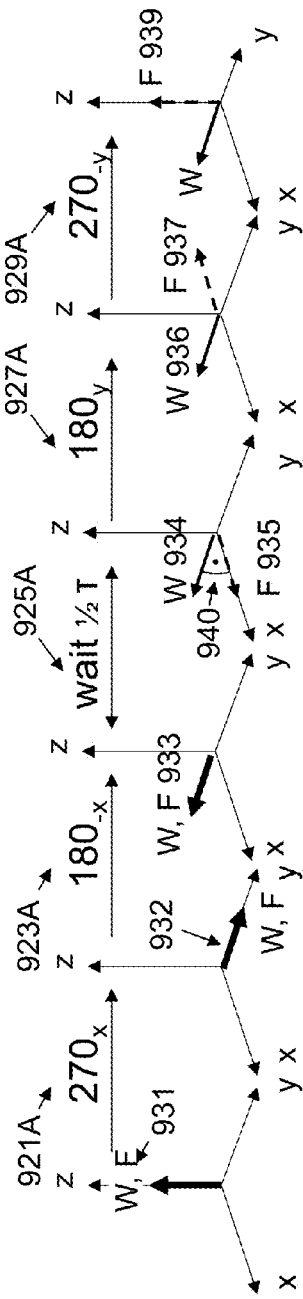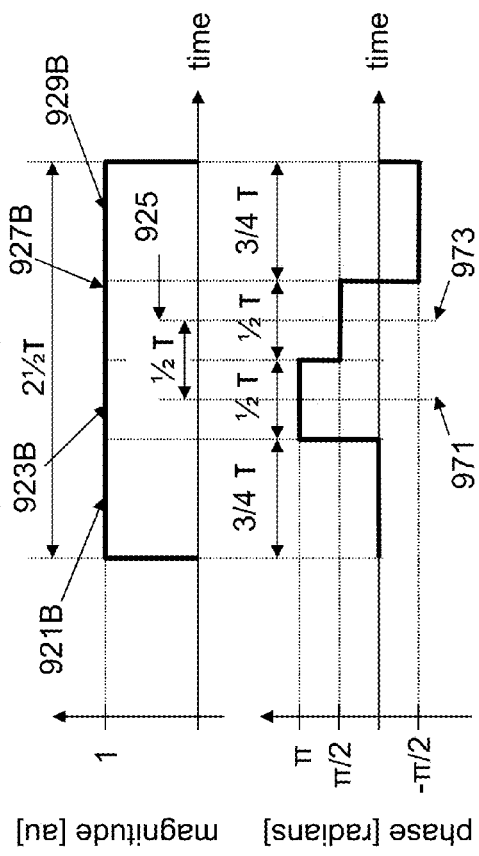

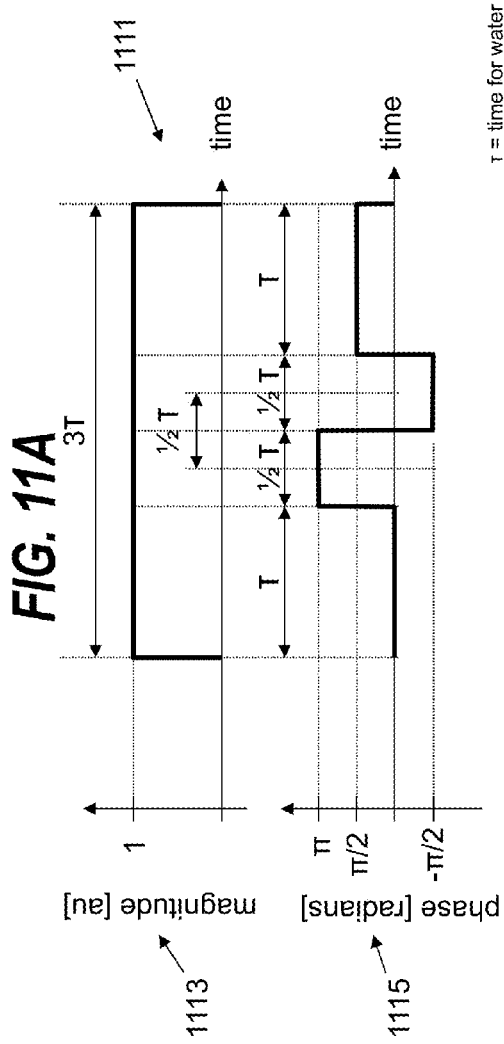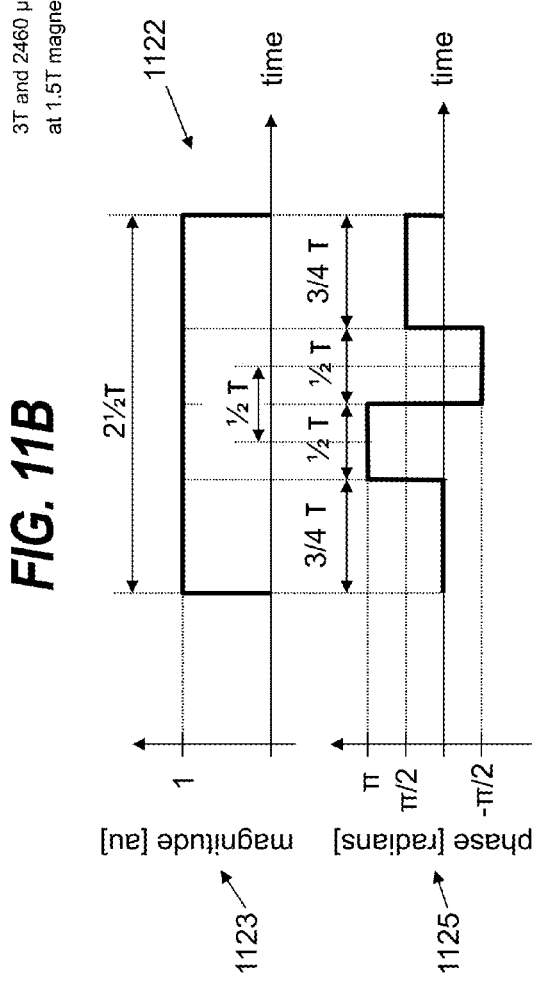

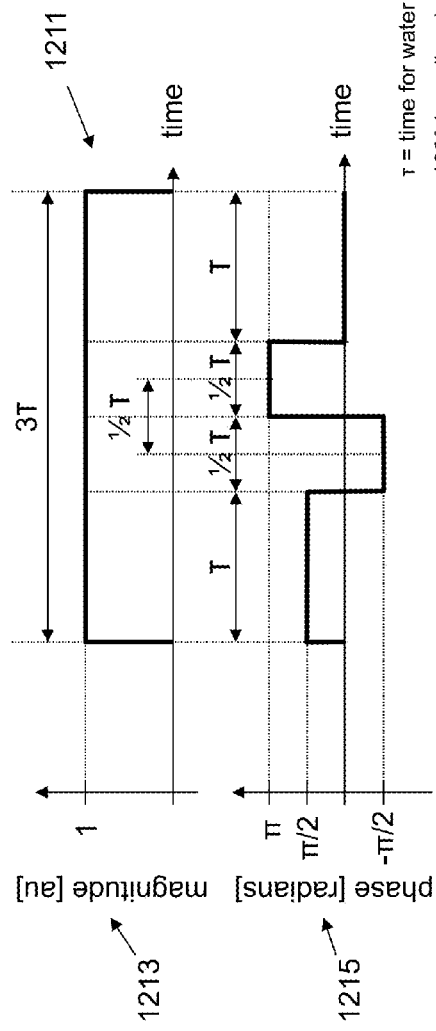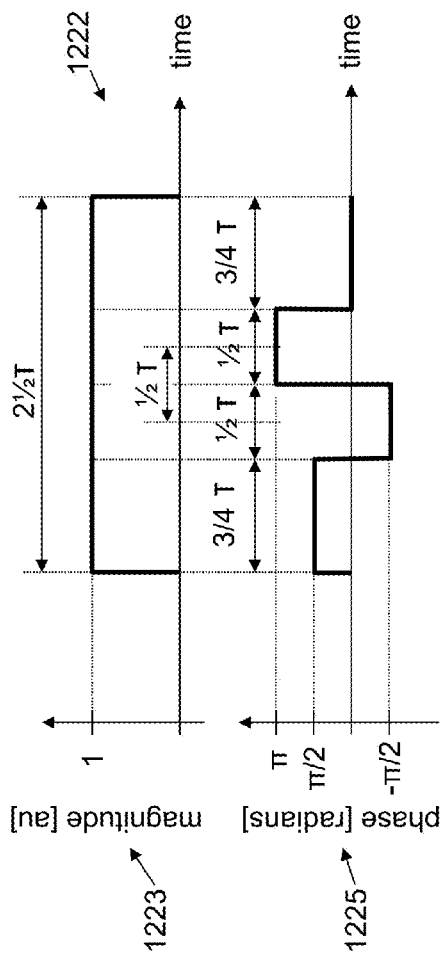

τ = time for water and fat to get 180° (π radians) out of phase
τ ≈ 1230 μs at 3T and 2460 μs at 1.5T magnetic field strength τ = time for water and fat to get 180° (π radians) out of phase
τ ≈ 1230 μs at 3T and 2460 μs at 1.5T magnetic field strength

USING SINGLE CONTINUOUS PULSES FOR MANIPULATING WATER AND FAT SIGNALS IN MAGNETIC RESONANCE IMAGING

CROSS-REFERENCE TO RELATED APPLICATIONS

This application claims priority to U.S. provisional application Ser. No. 61/712,384 filed Oct. 11, 2012, which is incorporated herein by reference in its entirety.

TECHNOLOGY FIELD

The present disclosure relates generally to methods, systems, and apparatuses for employing a single continuous pulse that may be used, for example, in the independent manipulation of water and fat magnetization. The disclosed methods, systems, and apparatuses are well suited, but not limited to, use in in fat-selective inversion, water-selective inversion, or fat suppressed T2-preparation modules.

BACKGROUND

Magnetic Resonance Imaging ("MRI") is a medical imaging technique used to visualize tissues and other internal structures of the body. Components of the tissue such as water, fat, and blood each react to magnetization differently, thus these components can vary in their brightness and intensity in an MRI image. Often, clinicians will seek to use these variations to highlight areas of interest. One common technique is to limit the intensity of fat in an MRI image such that fat appears dark, while non-fat structures appear as shades of gray between black and white.

One of the most commonly used techniques for fat suppression is the Composite RF Pulses technique. This technique uses a series of pulses separated by small delays to create 180° phase shifts between fat and water. The Composite RF Pulses technique provides several benefits over other conventional fat suppression techniques. For example, the Composite RF technique is not dependent on the frequency separation between fat and water. Thus, the technique may be effectively used for low-field MR settings wherein the fat-water separation is minimal. Moreover, the Composite RF Pulses technique is also relatively insensitive to non-uniformity in the B1 field. Thus, the technique may also be used in high-field settings.

One drawback of the Composite RF Pulses technique is that it involves large phase shifts which, in turn, require relatively large time delays between each pulse in the series. This results in large phase errors in the presence of B0 inhomogeneity. Moreover, because B0 inhomogeneity increases with B0 field strength, phase errors also increase with field strength. Thus, the Composite RF Pulses technique will either perform poorly or fail to perform in clinical settings where the B0 field strength is high. For example, the technique may erroneously identify water as fat and vice versa.

SUMMARY

Embodiments of the present invention address and overcome one or more of the above shortcomings and drawbacks, by providing methods, systems, and apparatuses for employing a single continuous pulse for independent manipulation of water and fat magnetization. More specifically, single continuous pulse described herein independently conditions water and fat magnetization in a patient or imaged sample.

According to one aspect of the present invention, as described in some embodiments, a method for manipulating magnetic resonance signals of a first chemical species and a second chemical species includes determining a time required to have spins of protons corresponding to the first chemical species acquire a phase shift of 90 degrees relative to spins of protons corresponding to second chemical species. A first pulse portion having a pulse amplitude and a first constant phase is defined. A second pulse portion having the pulse amplitude and a second constant phase, the second constant phase being different from said first constant phase by a multiple of 90 degrees is also defined. Next, a single continuous composite pulse is generated by concatenating the first pulse portion and the second pulse portion, wherein the single continuous composite pulse has a duration such that a time difference between center of the first pulse portion and center of the second pulse portion corresponds to the determined time. Then, the single continuous composite pulse is applied to a plurality of radio frequency coils. In one embodiment, the first chemical species is fat and the second chemical species is water.

The single continuous composite pulse may provide several different rotations over the magnetization of the first and second species. For example, in one embodiment, the single continuous composite pulse rotates the magnetization of the first chemical species by 90 degrees while maintaining the magnetization of the second chemical species in its original orientation. In another embodiment, the single continuous composite pulse rotates the magnetization of the first chemical species from a longitudinal direction to a transverse plane while maintaining magnetization of the second chemical species along the longitudinal direction. In another embodiment, the single continuous composite pulse rotates magnetization of the first chemical species by 90 degrees while inverting magnetization of the second chemical species. In another embodiment, the single continuous composite pulse rotates magnetization of the first chemical species from a transverse plane to a longitudinal direction while inverting the magnetization of the second chemical species along the longitudinal direction.

In some embodiments, the single composite pulse may comprise additional portions. For example, in some embodiments, the aforementioned method further includes defining a leading pulse portion having the pulse amplitude and a leading constant phase and defining a trailing pulse portion having the pulse amplitude and a trailing constant phase, the leading constant phase being different from said first constant phase by a multiple of 90 degrees. The generated single continuous composite pulse then further comprises the leading pulse portion preceding the concatenation of the first pulse portion and the second pulse portion and the trailing pulse portion following the concatenation of the first pulse portion and the second pulse portion. In one embodiment, the leading pulse portion and the trailing pulse portion each have a duration in the generated single continuous composite pulse equal to a multiple of the determined time. In one embodiment, the leading pulse portion and the trailing pulse portion each have a duration in the generated single continuous composite pulse which is equal to the determined time.

According to another aspect of the present invention, as described in some embodiments, an imaging system for manipulating magnetic resonance signals of a first chemical species associated with a first resonant frequency and a second chemical species associated with a different second resonant frequency includes at least at least one RF (Radio Frequency) coil. This coil provides a single continuous RF pulse of constant amplitude and comprising: (a) a first constant phase in a first portion and (b) a second constant phase during a second portion, the second constant phase being different from said first constant phase by a multiple of 90 degrees. In this system, single continuous RF pulse has a duration such that a time difference between a center of the first portion and a center of the second portion corresponds to a time required to have first spins of the first chemical species acquire a phase shift of 90 degrees relative to second spins of the second chemical species. In some embodiments, the system further comprises a magnetic field gradient generator for generating anatomical volume select magnetic field gradients for phase encoding, and for use with the RF coil for readout RF data acquisition in a two or three dimensional (2D or 3D) anatomical volume. In one embodiment, the single continuous RF pulse has a total duration of twice the time required to have first spins corresponding to the first chemical species acquire a phase shift of 90 degrees relative to second spins corresponding to the second chemical species.

The single continuous composite pulse may provide several different rotations over the magnetization of the first and second species. For example, in one embodiment, the single continuous RF pulse performs two consecutive orthogonal spin rotations. In one embodiment, the single continuous RF pulse rotates the magnetization of the first chemical species by 90 degrees while maintaining the magnetization of the second chemical species in its original orientation. In another embodiment, the single continuous RF pulse rotates magnetization of the first chemical species from a longitudinal direction to a transverse plane while maintaining magnetization of the second chemical species along the longitudinal direction. In another embodiment, the single continuous RF pulse rotates the magnetization of the first chemical species by 90 degrees while inverting the magnetization of the second chemical species. In another embodiment, the single continuous RF pulse rotates the magnetization of the first chemical species from a transverse plane to a longitudinal direction while inverting the magnetization of the second chemical species along the longitudinal direction.

According to another aspect of the present invention, as described in some embodiments, an article of manufacture for determining concentration of a contrast agent in imaging data comprises a non-transitory, tangible computer-readable medium holding computer-executable instructions for performing a method. The method includes determining a time required to have spins of protons corresponding to the first chemical species acquire a phase shift of 90 degrees relative to spins of protons corresponding to second chemical species. A first pulse portion having a pulse amplitude and a first constant phase is defined. A second pulse portion having the pulse amplitude and a second constant phase, the second constant phase being different from said first constant phase by a multiple of 90 degrees is also defined. Next, a single continuous composite pulse is generated by concatenating the first pulse portion and the second pulse portion, wherein the single continuous composite pulse has a duration such that a time difference between center of the first pulse portion and center of the second pulse portion corresponds to the determined time. Then, the single continuous composite pulse is applied to a plurality of radio frequency coils. In some embodiments, the method further includes defining a leading pulse portion having the pulse amplitude and a leading constant phase and defining a trailing pulse portion having the pulse amplitude and a trailing constant phase, the leading constant phase being different from said first constant phase by a multiple of 90 degrees. The generated single continuous composite pulse may then further comprise the leading pulse portion preceding the concatenation of the first pulse portion and the second pulse portion and the trailing pulse portion following the concatenation of the first pulse portion and the second pulse portion. In one embodiment, the leading pulse portion and the trailing pulse portion each have a duration in the generated single continuous composite pulse equal to a multiple of the determined time. In one embodiment, the leading pulse portion and the trailing pulse portion each have a duration in the generated single continuous composite pulse which is equal to the determined time.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures:

FIG. 1 shows system for independently conditioning water and fat magnetization in a patient or imaged sample using a single continuous pulse, as used some embodiments of the present invention;

FIGS. 3A and 3B illustrate an example of a continuous composite pulse, referred to herein as pulse "type I", as utilized in some embodiments of the present invention;

FIGS. 4A and 4B illustrates an example of a continuous composite pulse, referred to herein as pulse "type II", as utilized in some embodiments of the present invention;

FIGS. 6A and 6B illustrates a third example of a continuous composite pulse, referred to herein as pulse "type III", as utilized in some embodiments of the present invention;

FIGS. 9A and 9B illustrates a fifth example of a continuous composite pulse, referred to herein as a "type IC" pulse, used in some embodiments of the present invention;

FIG. 11A shows the rotation scheme of pulse "type IIIB", its timing, amplitude, and phase modulation functions;

FIG. 11B the rotation scheme of pulse "type IIIC", its timing, amplitude, and phase modulation functions;

FIG. 12A shows the rotation scheme of pulse "type IVB", its timing, amplitude, and phase modulation functions;

FIG. 12B shows the rotation scheme of pulse "type IVC", its timing, amplitude, and phase modulation functions;

DETAILED DESCRIPTION OF ILLUSTRATIVE EMBODIMENTS

Figure 2A:
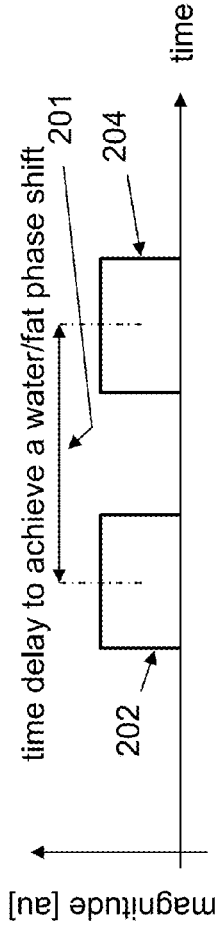
FIGS. 2A, 2B, and 2C provide an illustration of composite pulses that may be used in a conventional RF Composite Pulses technique, and their practical limitations.

The following disclosure describes the present invention according to several embodiments directed at methods, systems, and apparatuses employing a single continuous pulse for independently manipulating water and fat magnetization. More specifically, using the techniques described herein, a single continuous pulse independently conditions water and fat magnetization in a patient or imaged sample. For example, in one embodiment, for a single MR image, the system creates different image contrast for water and fat by concurrently using different techniques to determine water and fat magnetization. This property may be used, for example, by a T2-preparation module to weigh water magnetization according to its local T2 values while concurrently inverting fat magnetization to suppress a fat signal. The methods, systems, and apparatuses described herein are well suited, but not limited to, use in in fat-selective inversion, water-selective inversion, or fat suppressed saturation modules.

FIG. 1 shows system 10 for independently conditioning water and fat magnetization in a patient or imaged sample using a single continuous pulse, as used some embodiments of the present invention. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. ECG synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements individually have a radius to the designated center;

A magnetic field generator (comprising magnetic coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

Figure 2B:
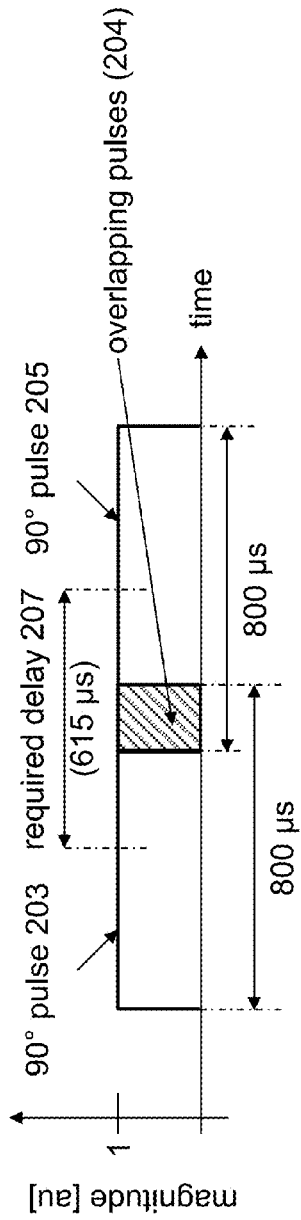
Figure 2C:
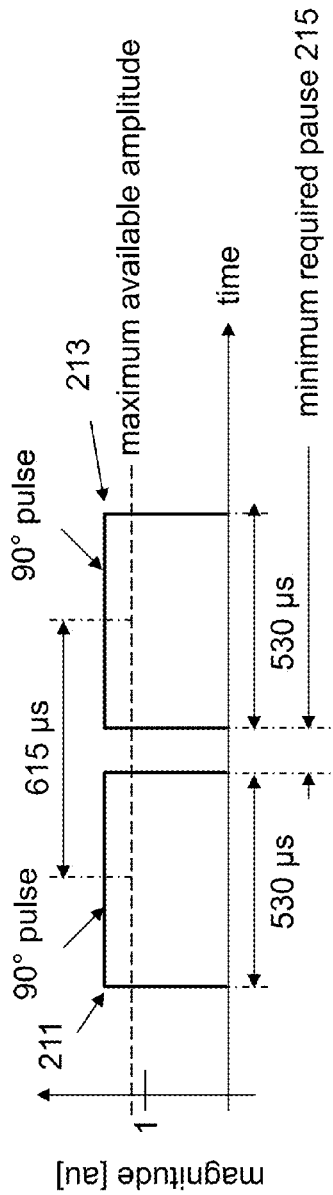

FIGS. 2A, 2B, and 2C provide an illustration of composite pulses that may be used in a conventional RF Composite Pulses technique. As noted above, a drawback of the Composite RF Pulses technique is that it involves large phase shifts which, in turn, require relatively large time delays between the each pulse in the series. These delays result in large phase errors in the presence of BO inhomogeneity. In theory, with reference to FIG. 2A, one could reduce these phase errors by shortening the time delay 201 between the pulses 202 and 204. This shorter delay can be achieved by aiming only for a 90° water/fat phase shift instead of 180°. In turn, this could reduce the phase error by one half. However, as explained below with reference to FIGS. 2A and 2B, there are several practical reasons why phase errors cannot be reduced in clinical practice, especially when large B0 field strengths are used.

FIG. 2B illustrates the pulse sequence needed to achieve a 90° water/fat phase shift. Specifically, a 90° phase shift requires a time delay of 615 μs (3 T scanners have a slightly lower field strength than 3 T leading to the time delay of 615 μs), measured between the pulse centers. Unfortunately, on clinical MRI scanners such a short time delay cannot be realized for field strengths of 3 Tesla or greater because, when respecting the power limits of the RF amplifier, the typical duration of each pulse 203 and 205 would be too long to play out delay 207. Consequently, the pulses overlap as shown in 204. Thus, sequence such as illustrated in FIG. 2B cannot be played out in practice due to technical limitations of the scanner hardware. Note that the pulse duration of 800 μs is a typical value, but that the exact value depends on loading of the scanner's transmitter coil, which is a function of patient weight and conductivity.

FIG. 2C provides pulse sequence that eliminates the overlap 204 shown in FIG. 2B. However, the sequence shown in FIG. 2C also cannot be used in clinical practice because the amplitudes of the pulses (211, 213) would exceed a clinical MRI scanner's power limits. Moreover, for many MRI scanners, this sequence may also present significant phase errors due to the minimum pause 215 required between consecutive excitation pulses.

In embodiments of the present invention, a single pulse with one continuous waveform, referred to herein as a "continuous composite pulse" is used to address some of the aforementioned drawbacks and deficiencies of the conventional RF Composite Pulses technique with respect to fat separation. For example, the continuous composite pulse described by some embodiments enables shorter time delays without exceeding a maximum pulse amplitude. The length of the continuous composite pulse may be a function of the frequency difference between water and fat expressed as τ (tau), the time for water and fat to get 180° (π radians) out of phase.

FIGS. 3A and 3B illustrate an example of a continuous composite pulse 319, referred to herein as pulse "type I", as utilized in some embodiments of the present invention. This pulse includes a 90° rotation around x 321A, a built-in time delay of ½τ 323, and a 90° rotation around −y 325A. Water and fat magnetization 301 (labeled "W" and "F," respectively) start out aligned with the z-axis 331. Rotation 321, which is effectuated by the first half of pulse 319 (i.e., pulse portion 321B), flips W and F onto the −y axis 302. After time delay ½τ 323 relative to the center 351 of the first rotation 321A, fat 305 has acquired a 90° phase shift 304 relative to water 303. The rotation 325 about −y, which is effectuated by the second half of pulse 319 (i.e., pulse portion 325B), flips F onto the positive z axis to position 307. Water is unaffected by the rotation and remains in position 309. Although pulse 319 is a continuous pulse, it may be conceptualized as two individual 90° rotations 321 and 325A played back to back. The distance from rotation center 351 to rotation center 353 is chosen to be substantially ½τ. The total pulse duration is τ. In one embodiment, each half of the pulse has a different amplitude, while the difference between rotation centers remains ½τ, with pulse length τ. Pulse "type I" may be used, for example in water selective excitation, tip-down pulse, or saturation applications.

FIGS. 4A and 4B illustrates an example of a continuous composite pulse 419, referred to herein as pulse "type II", as utilized in some embodiments of the present invention. This continuous composite pulse is referred to herein pulse "type II". The pulse is used for an initial water magnetization 402 (labeled "W") in the transverse plane, on the −y axis, and an initial fat magnetization 401 (labeled "F") on the +z axis. This magnetization state may occur, for example, after application of pulse type I and having manipulated transverse magnetization, as is the case for T2-preparation or saturation. Type II pulses include a 90° rotation around y 421A, a built-in time delay of ½τ 423 (e.g., 615 μs at 3 T), and a 90° rotation around −x 425A. Rotation 421A, which is effectuated by the first half of pulse 419 (i.e., pulse portion 421B), rotates water about its own axis from 402 to 403, and flips fat from its position on the z-axis 401 into the transverse plane onto the x axis 404. After time delay ½τ 423 between the center 451 of the first rotation 421A and the center 453 of the second rotation 425A, fat 406 has acquired a 180° phase shift 410 relative to water 405. Note that the fat/water shift created by the time delay is only 90° corresponding to ½τ, and that the 180° phase shift is the sum of the initial 90° angle between water and fat and the additional 90° due to ½τ. The rotation 425A about −x, which is effectuated by the second half of pulse 419 (i.e., pulse portion 425B), flips water onto the positive z-axis to position 407 and fat onto the negative z-axis to position 409. The effect of the entire pulse is to flip back water to the z-direction and invert fat along the z-axis.

Figure 5A:
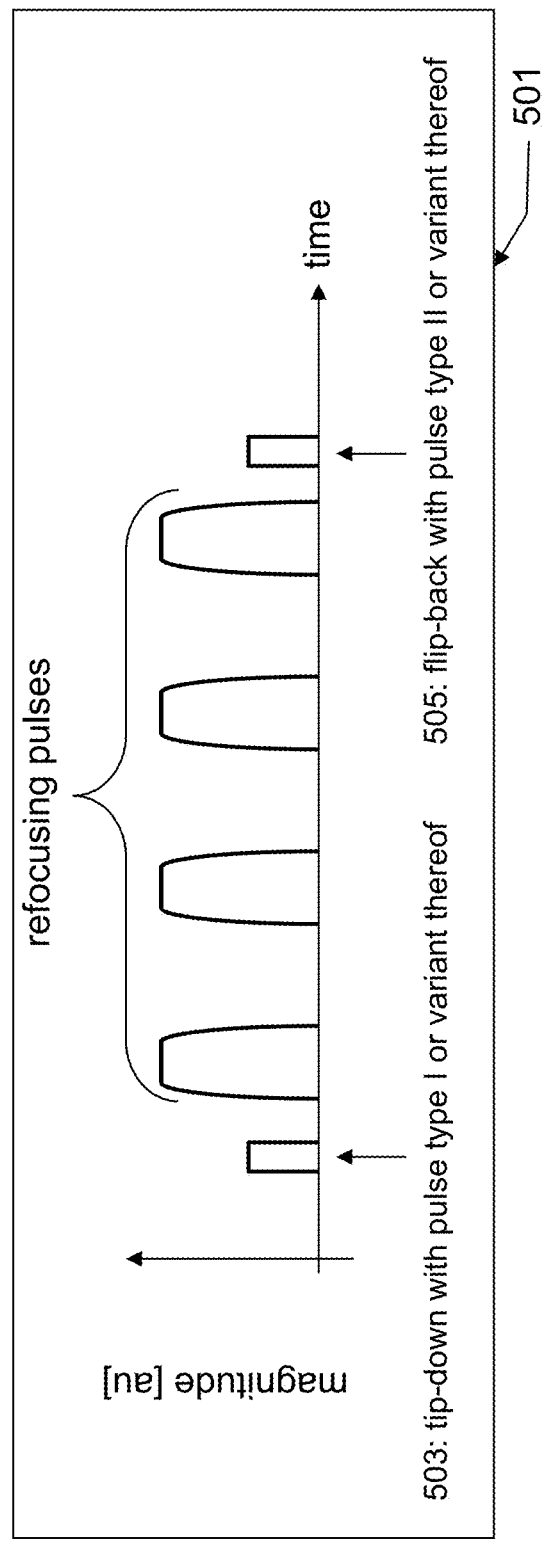
FIG. 5A shows a T2-preparation module using pulses of type I and II as a tip-down and flip-back pulse, respectively.
Figure 5B:
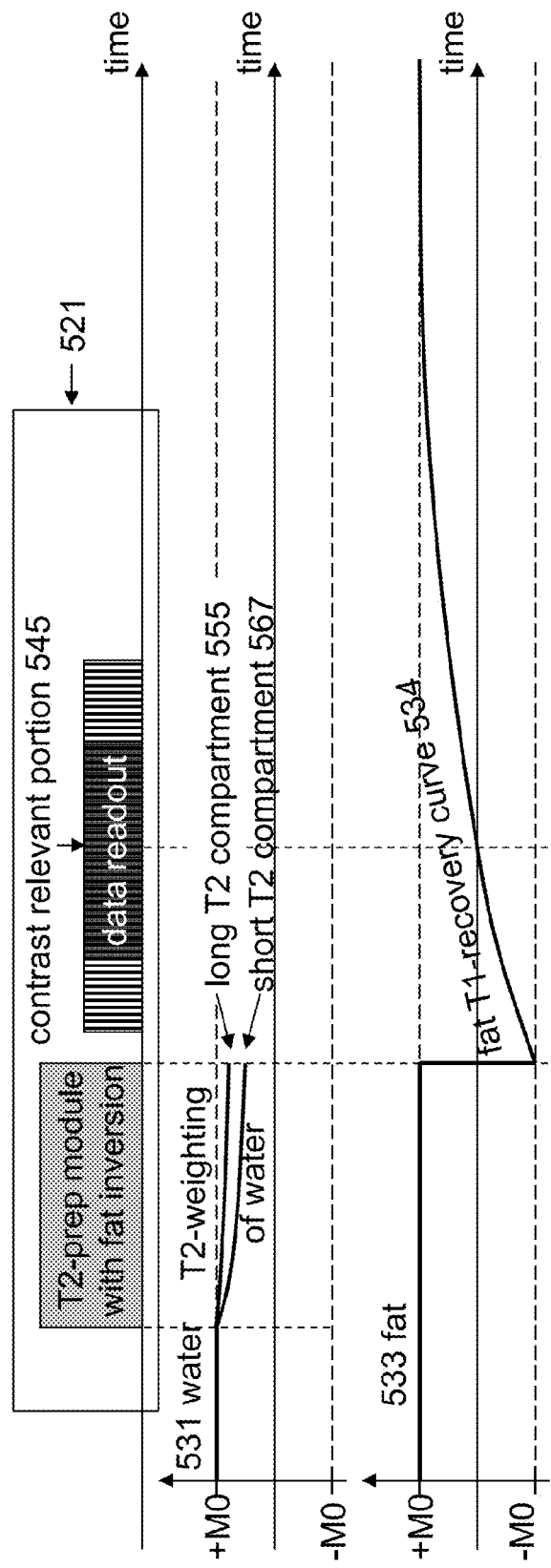
FIG. 5B shows the use of a T2-preparation module as part of an MRI pulse sequence and its effect on water and fat magnetization, according to some embodiments of the present invention.

FIG. 5A shows a T2-preparation module 501 using pulses of type I and II as tip-down 503 and flip-back pulse 505, respectively. FIG. 5B shows the use of this module 501 as part of an MRI pulse sequence 521 and its effect on water 531 and fat magnetization 533. By reading out the contrast relevant portion 545 of the data when the fat T1-recovery curve 534 crosses the zero-magnetization line, the fat signal may be suppressed. Water magnetization is weighted by its T2 time allowing the differentiation of a region 555 with a long T2 value and a region 567 with a short T2 value.

FIGS. 6A and 6B illustrates a third example of a continuous composite pulse 619, referred to herein as pulse "type III", as utilized in some embodiments of the present invention. The pulse is used with an initial longitudinal fat and water magnetization 601. The pulse 619 provides tip-down of water magnetization into the transverse plane while concurrently inverting fat magnetization along the z-axis. This may be used, for example, for a combined T2-preparation/fat inversion module that aims to null fat as soon after the module as possible. A pulse of type III may be contrasted with a pulse type II that is played as flip back pulse at the end of a combined T2-preparation/fat inversion module with the aim of nulling fat as late after the module as possible.

Continuing with reference to FIGS. 6A and 6B, rotation 621A, which is effectuated by the first half 621B of pulse 619, flips water and fat onto the −y axis 602. After time delay ½τ 623 between the center 651 of the first rotation 621A and the center 653 of the second rotation 625B, fat 603 has acquired a 90° phase shift 604 relative to water 605. The rotation 625A about the y axis, which is effectuated by the second half 625B of pulse 619, flips fat onto the -z axis to position 605. Water is unaffected by the rotation and remains in position 607. Pulse 619 is a continuous pulse, but one can understand it as two 90° rotations 621 and 625 played back to back. The distance from rotation center 651 to rotation center 653 is chosen to be ½τ for total pulse duration τ.

Figure 7A:
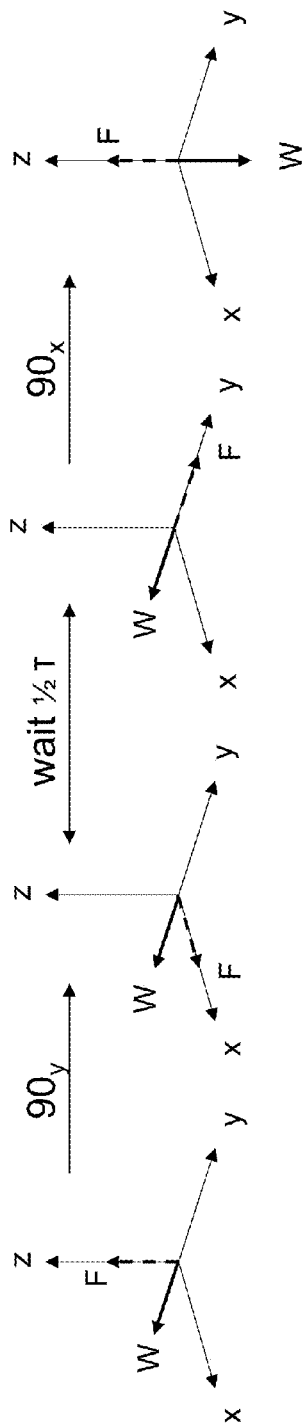
FIGS. 7A and 7B illustrates a fourth example of a continuous composite pulse, referred to herein as pulse "type IV," used in some embodiments of the present invention.
Figure 7B:
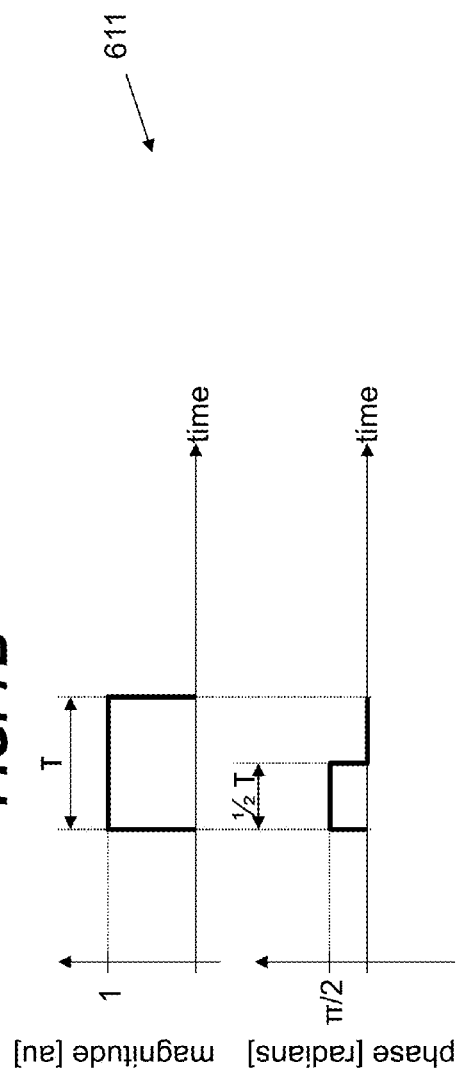

FIGS. 7A and 7B illustrates a fourth example of a continuous composite pulse, referred to herein as pulse "type IV," used in some embodiments of the present invention. This pulse is similar to type II. Its function is to flip water magnetization from the transverse plane onto the negative z-axis while keeping fat untouched. This pulse may be used, for example, as "flip-back" component of a T2-preparation to effectively creating a combined T2-preparation and inversion module that imparts a mixed T2 and T1 contrast. Details of rotation axes, timing and delay are similar to pulse types I, II and III.

Figure 8A:
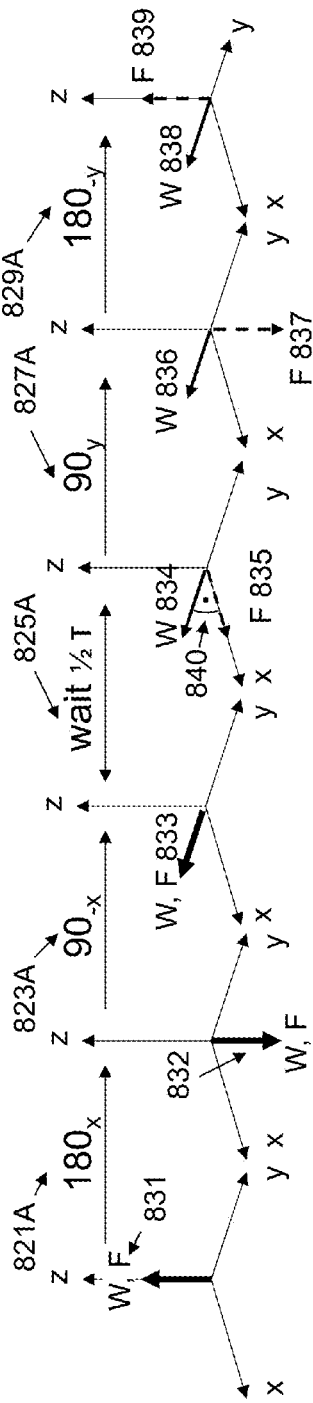
FIGS. 8A and 8B illustrates a fourth example of a continuous composite pulse, referred to herein as a "type IB" pulse.
Figure 8B:
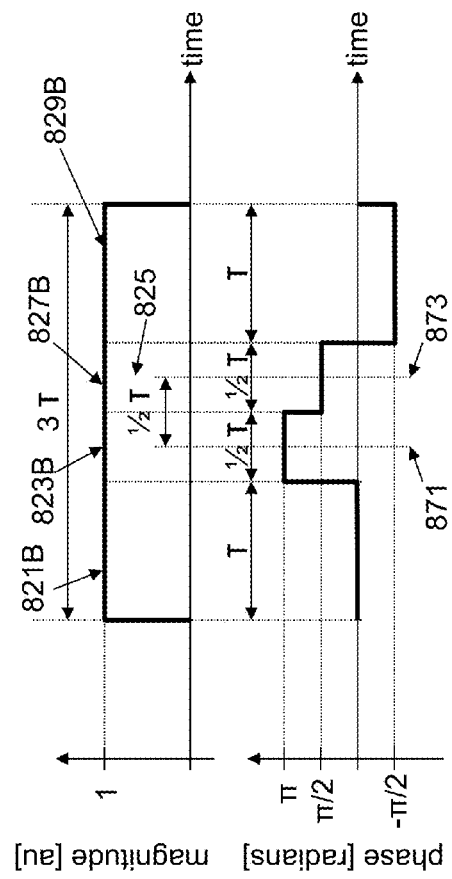

FIGS. 8A and 8B illustrate a fourth example of a continuous composite pulse, referred to herein as a "type IB" pulse. The type IB pulse is a version of pulse type I with improved B1 performance. The leading $180_x$-$90_{-x}$ pair 821A, 823A replaces the $90_x$ pulse 321A in type I, the trailing $90_y$-$180_{-y}$ pair 827A, 827B replaces the $90_{-y}$ pulse 325A in type I. The purpose of these composite pulse pairs is to reduce the flip angle error that a single 90° pulse may have. By applying two pulses that have flip angles of opposite sign, any constant error of the first pulse will be compensated by the same error of the second, because its error is equal in magnitude but opposite in sign. The pairs in type IB have the same net flip angle as the single pulses in type I.

Note that the pulse illustrated in FIGS. 8A and 8B is a single continuous pulse, but to better understand its function, it is decomposed into individual parts in this description. Rotation 821A (corresponding to pulse portion 821B) brings water and fat magnetization from position 831 to position 832. The consecutive rotation 823A (corresponding to pulse portion 823B) brings water and fat magnetization to position 833 on the -y axis. During the following delay time ½τ 825 fat 835 acquires a 90° phase shift 840 relative to water 834. Rotation 827A (corresponding to pulse portion 827B) rotates water about its own axis and thus it remains at position 834. However, the rotation 827A rotates fat to position 837. Rotation 829A (corresponding to pulse portion 829B) does not affect water at position 838, but moves fat onto the positive z axis to position 839. The time delay between the center 871 of rotation 823A and the center 873 of rotation 827 is ½τ, with a total pulse duration is 3τ.

FIGS. 9A and 9B illustrates a fifth example of a continuous composite pulse, referred to herein as a "type IC" pulse, used in some embodiments of the present invention. A pulse of type IC may provide improved B1 performance relative to type I and type IB pulses. The leading $270_x$-$180_{-x}$ pair 921A and 923A replaces the $90_x$ pulse 321A in type I, the trailing $180_y$-$270_{-y}$ pair 927A and 929A replaces the $90_{-y}$ pulse 325A in type I. The purpose of these composite pulse pairs is twofold. As for type IB, these pulses may reduce a constant error flip angle error that a single 90° pulse may produce. Additionally, they may reduce errors that are a non-linear function of the flip angle. The relative flip angle difference between the two pulses of the pair becomes smaller with increasing flip angle, and non-linear errors of both pulses become more similar and provide better compensation for one another.

Pulse type IC is a single continuous pulse like I and IB, but for the sake of understanding its function, in this description it is decomposed into individual parts. Continuing with reference to FIGS. 9A and 9B, rotation 921A (corresponding to pulse portion 921B) brings water and fat magnetization from position 931 to position 932. The consecutive rotation 923A (corresponding to pulse portion 923B) brings water and fat magnetization to position 933 on the -y axis. During the following delay time ½τ 925 fat 935 acquires a 90° phase shift 940 relative to water 934. Rotation 927A (corresponding to pulse portion 927B) rotates water about its own axis and thus has no effect. However, this rotation 927A rotates fat to position 937 on the -x axis. Rotation 929A (corresponding to pulse portion 929B) again does not affect water, but moves fat onto the +z axis to position 939. The time delay between the center 971 of rotation 923A and the center 973 of rotation 927A is ½τ, with a total pulse duration is 2½τ. The duration of the two 270° rotations should be considered for the pulse design as a fat/water shift is also acquired during the application of these rotations. Luckily, these shifts are compensated by the associated 180° pulses. The shift acquired by the $270_x$ 921A is compensated by the $180_{-x}$ 923A, and the shift of the $270_{-y}$ 929A is compensated by $180_y$ rotation 927A. The effective fat/water shift 940 of the entire pulse is only 90° allowing the separate treatment of fat and water. Note that pulse type IC requires more power than IB. Therefore, type IB may be suited for settings where the field strength is 3 T, whereas type IC may be used where the field strength is 1.5 T.

Figure 10A:
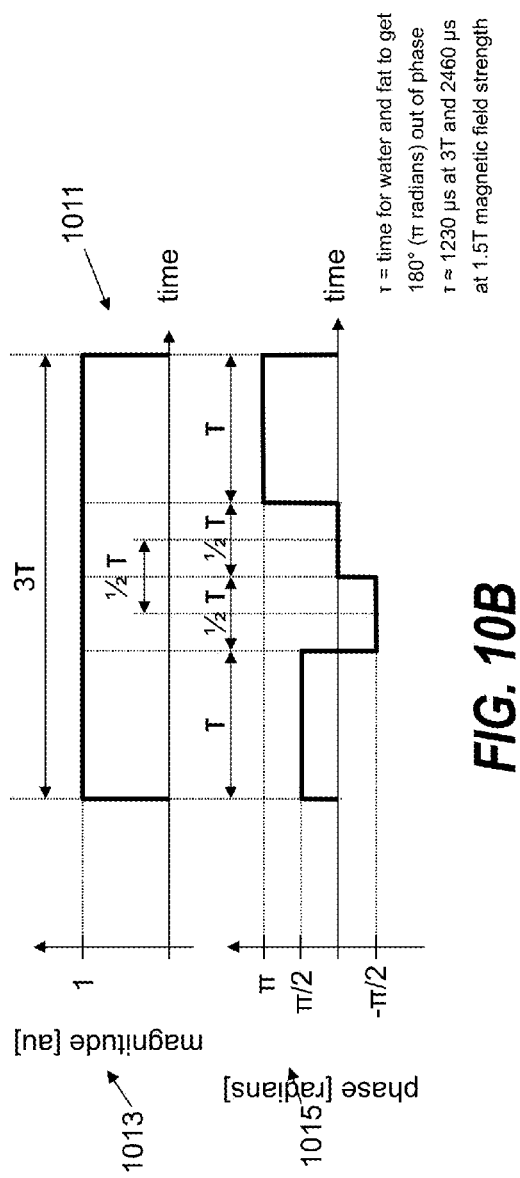
FIG. 10A shows the rotation scheme of pulse "type IIB", its timing, amplitude, and phase modulation functions.
Figure 10B:
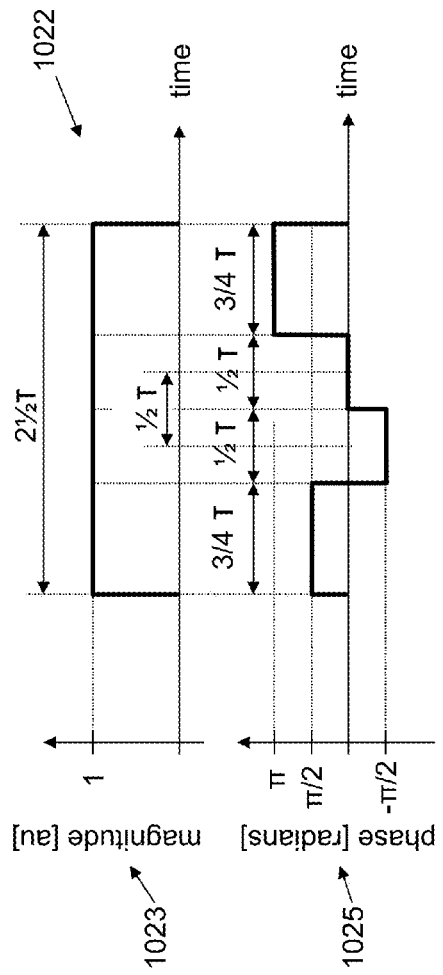
FIG. 10B the rotation scheme of pulse "type IIC", its timing, amplitude 1023 and phase modulation functions.

In some embodiments, one or more of pulse types II, II, and/or IV are improved by the same design principles used to create types IB and IC from type I. FIGS. 10-12 illustrate various pulses that can be created with these principles. Because the principles were discussed above with reference to types IB and IC, vector rotation diagrams are omitted from these figures and only the magnitude and phase diagrams are given. FIG. 10A shows the rotation scheme of pulse "type IIB" 1011, its timing, amplitude 1013 and phase 1015 modulation functions. FIG. 10B the rotation scheme of pulse "type IIC" 1022, its timing, amplitude 1023 and phase 1025 modulation functions. FIG. 11A shows the rotation scheme of pulse "type IIIB" 1111, its timing, amplitude 1113 and phase 1115 modulation functions. FIG. 11B the rotation scheme of pulse "type IIIC" 1122, its timing, amplitude 1123 and phase 1125 modulation functions. FIG. 12A shows the rotation scheme of pulse "type IVB" 1211, its timing, amplitude 1213 and phase 1215 modulation functions. FIG. 12B shows the rotation scheme of pulse "type IVC" 1222, its timing, amplitude 1223 and phase 1225 modulation functions.

Figure 13A:
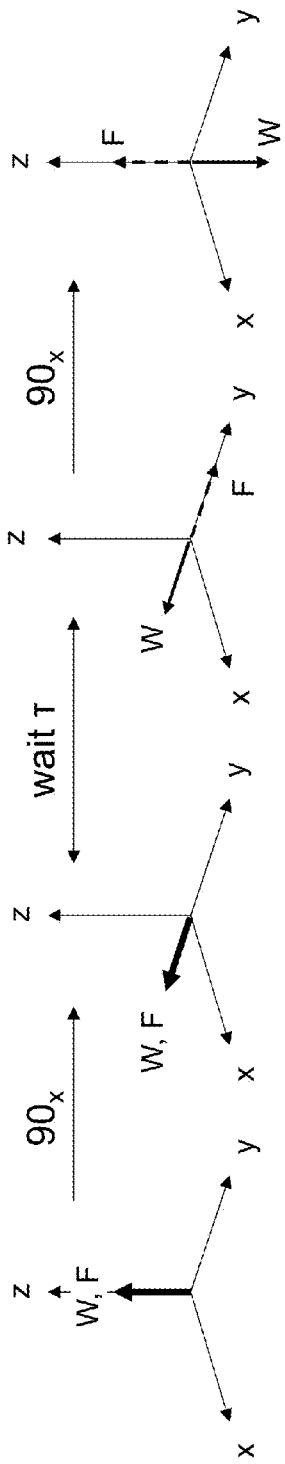
FIGS. 13A and 13B depict a continuous composite pulse, referred to herein as a pulse of "type V," used in some embodiments of the present invention.
Figure 13B:
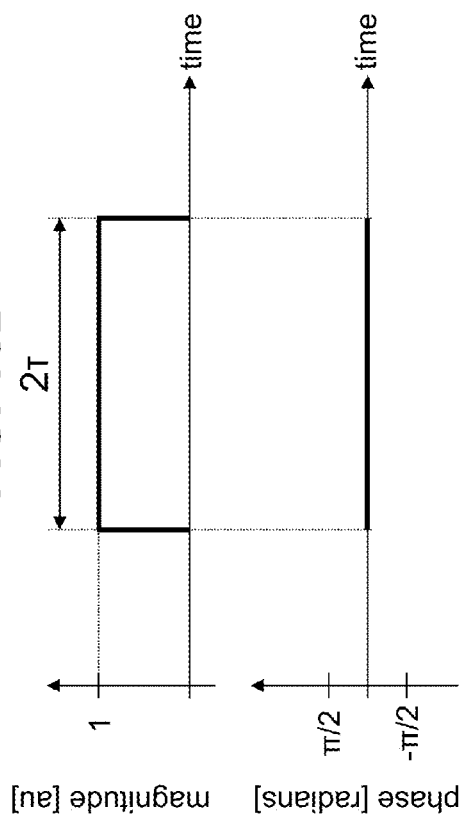

FIGS. 13A and 13B depict a continuous composite pulse, referred to herein as a pulse of "type V," used in some embodiments of the present invention. Pulses of type V may be used, for example, to invert water while keeping fat in its original orientation. Note that this pulse includes a time delay of τ to create a 180° fat/water phase shift. It has the advantage of being a single pulse rather than two individual pulses separated by a time delay. This may be used, for example, for systems using a high field strength where individual pulses could not be spaced closely enough.

Figure 14A:
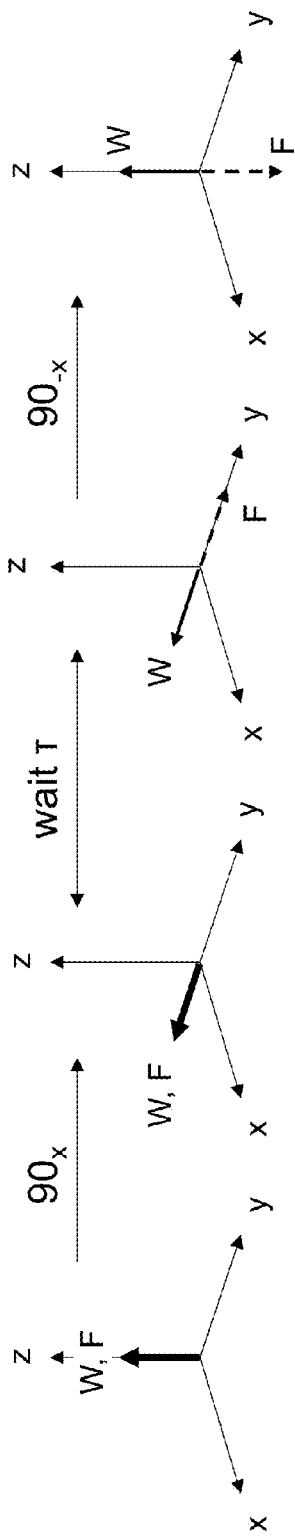
FIGS. 14A and 14B depict a continuous composite pulse, referred to herein as a pulse of "type VI," used in some embodiments of the present invention.
Figure 14B:
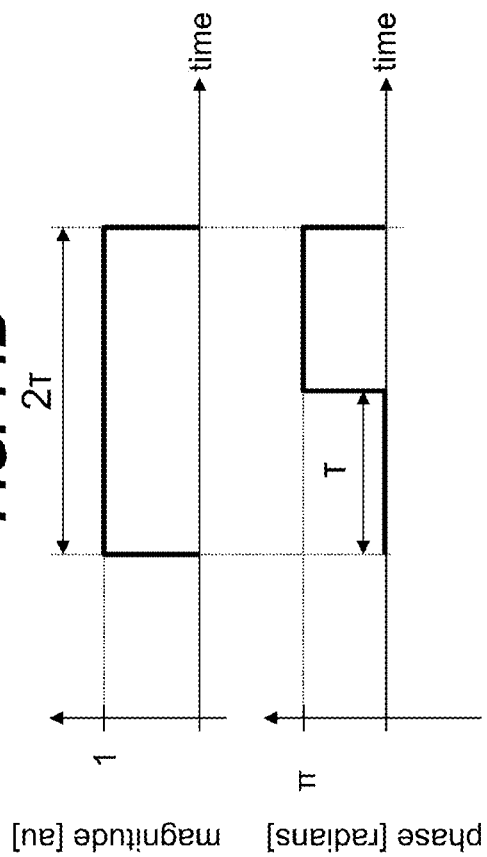

FIGS. 14A and 14B depict a continuous composite pulse, referred to herein as a pulse of "type VI," used in some embodiments of the present invention. Pulses of type V may be used, for example, to invert fat while keeping water in its original orientation.

Figure 15A:
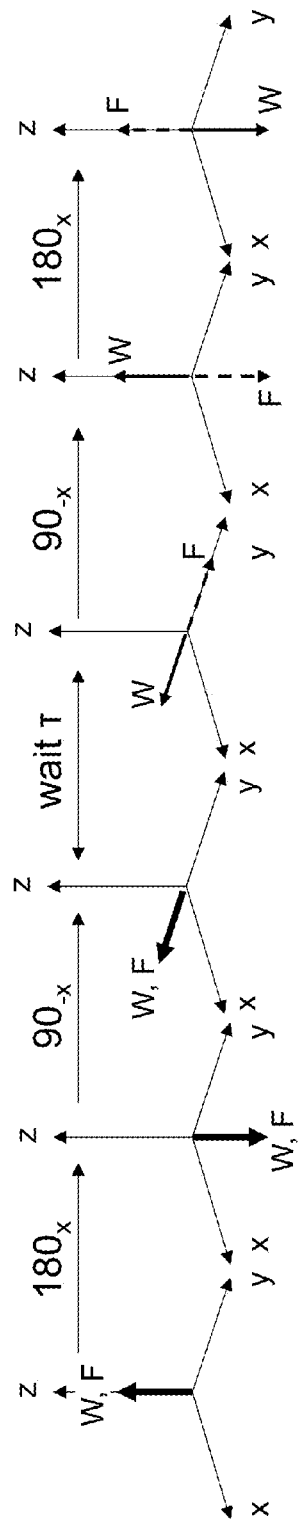
FIGS. 15A and 15B depict a variation on pulse type V, referred to herein as a pulse of "type VB," used in some embodiments of the present invention.
Figure 15B:
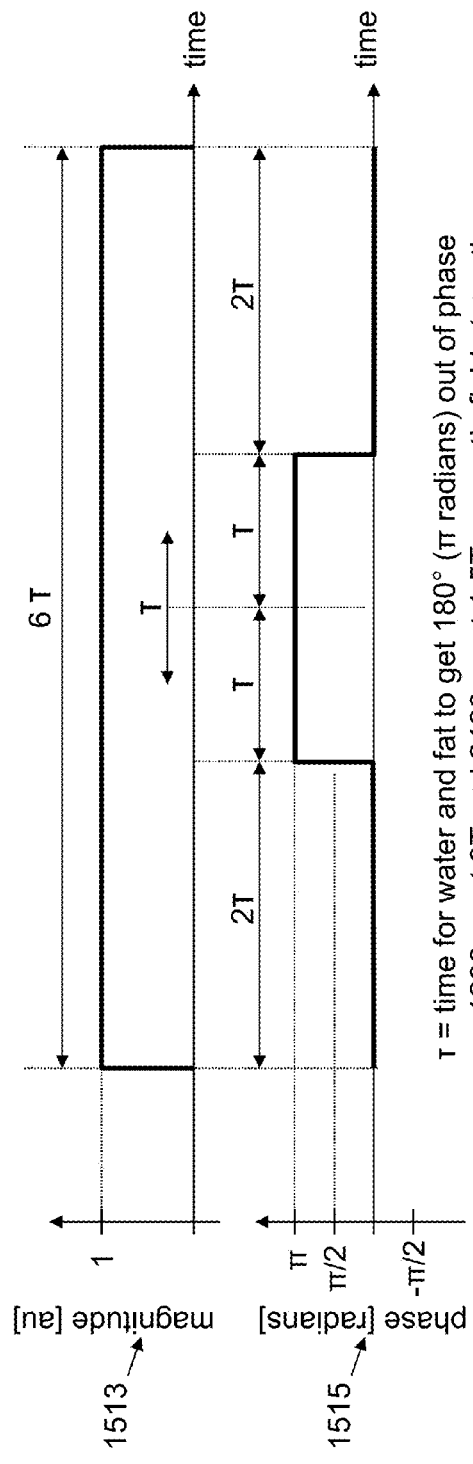

FIGS. 15A and 15B depict a variation on pulse type V, referred to herein as a pulse of "type VB," used in some embodiments of the present invention. Pulse type VB has improved B1 robustness compared to type V. Amplitude 1513 and phase modulation 1515 are shown. The rationale for improved B1 robustness is the same as for pulse type IB.

Figure 16A:
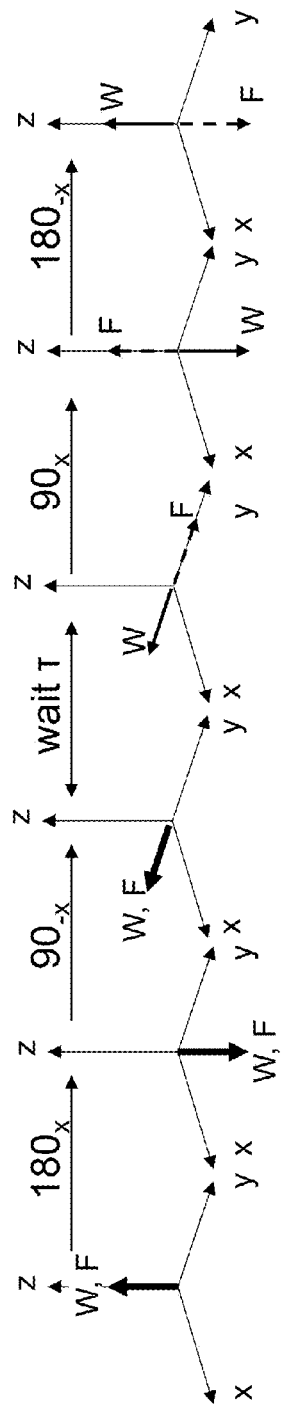
FIGS. 16A and 16B depict a variation on pulse type VI, referred to herein as a pulse of "type VIB," used in some embodiments of the present invention.
Figure 16B:
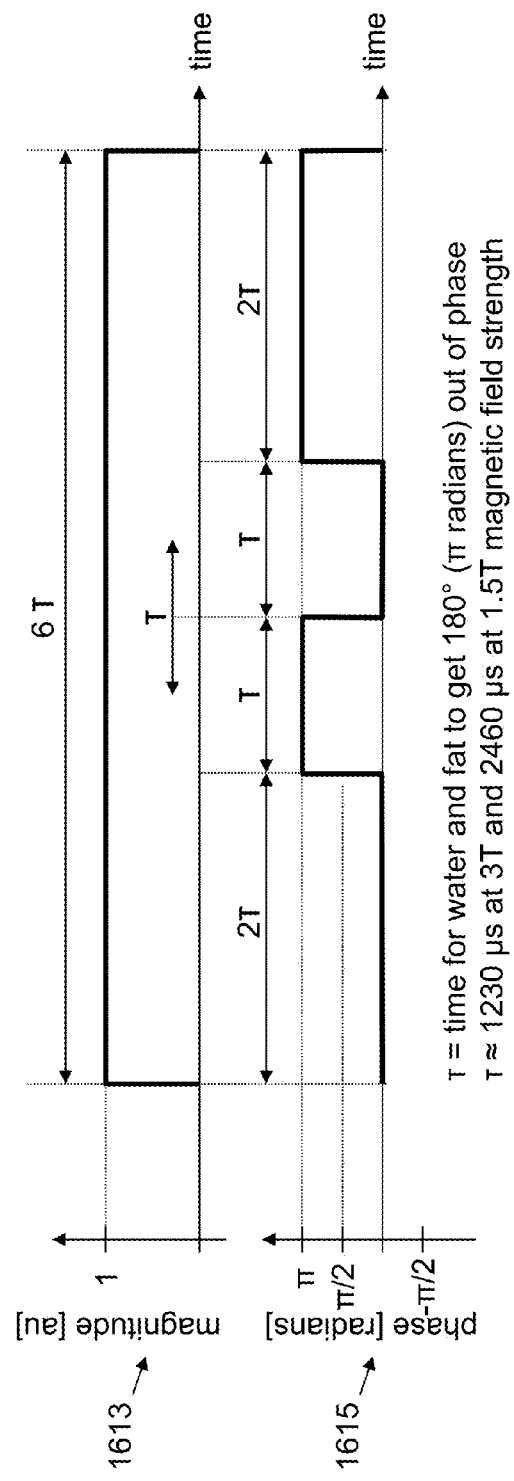

FIGS. 16A and 16B depict a variation on pulse type VI, referred to herein as a pulse of "type VIB," used in some embodiments of the present invention. Pulses of the type VIB have improved B1 robustness compared to type V. Amplitude 1613 and phase modulation 1615 are shown. The rationale for improved B1 robustness is the same as for pulse type IB.

Figure 17:
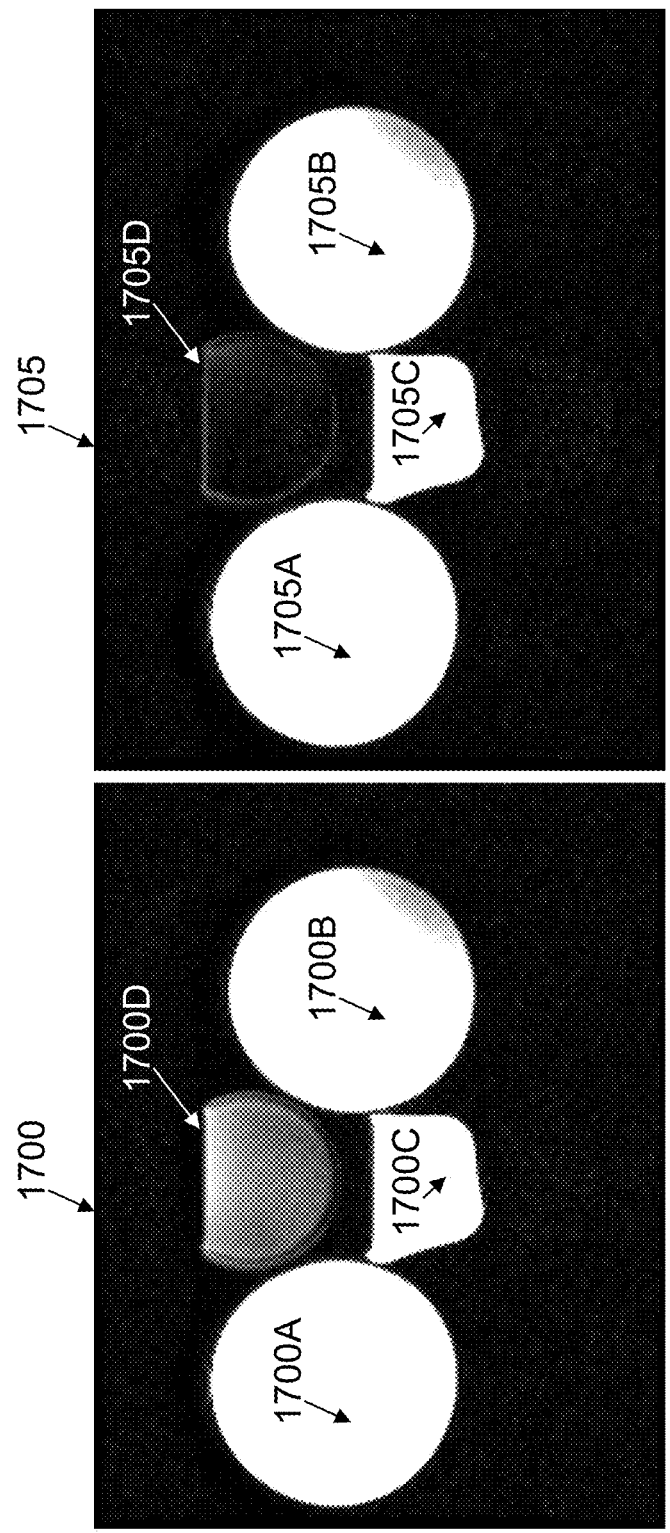
FIG. 17 shows phantom images demonstrating an example of pulse type I and II.

FIG. 17 shows phantom images demonstrating an example of pulse type I and II. Pulse type I is used as water-selective tip-down pulse of a T2-preparation module, type II as flip-back pulse with integrated fat inversion. A schematic drawing of the module and its manipulation of water and fat can be seen in FIGS. 5A and 5B. With a standard T2-preparation, shown in image 1700, fat compartment 1700D appears light grey while water compartments 1700A, 1700B, 1700C appears white. With the T2-preparation incorporating the pulses, as shown in 1705, fat compartment 1705D appears completely dark while water compartments 1705A, 1705B, 1705C again appears white. That is, the water signal is unchanged by the generated pulse compared to the conventional T2-preparation.

Figure 18:
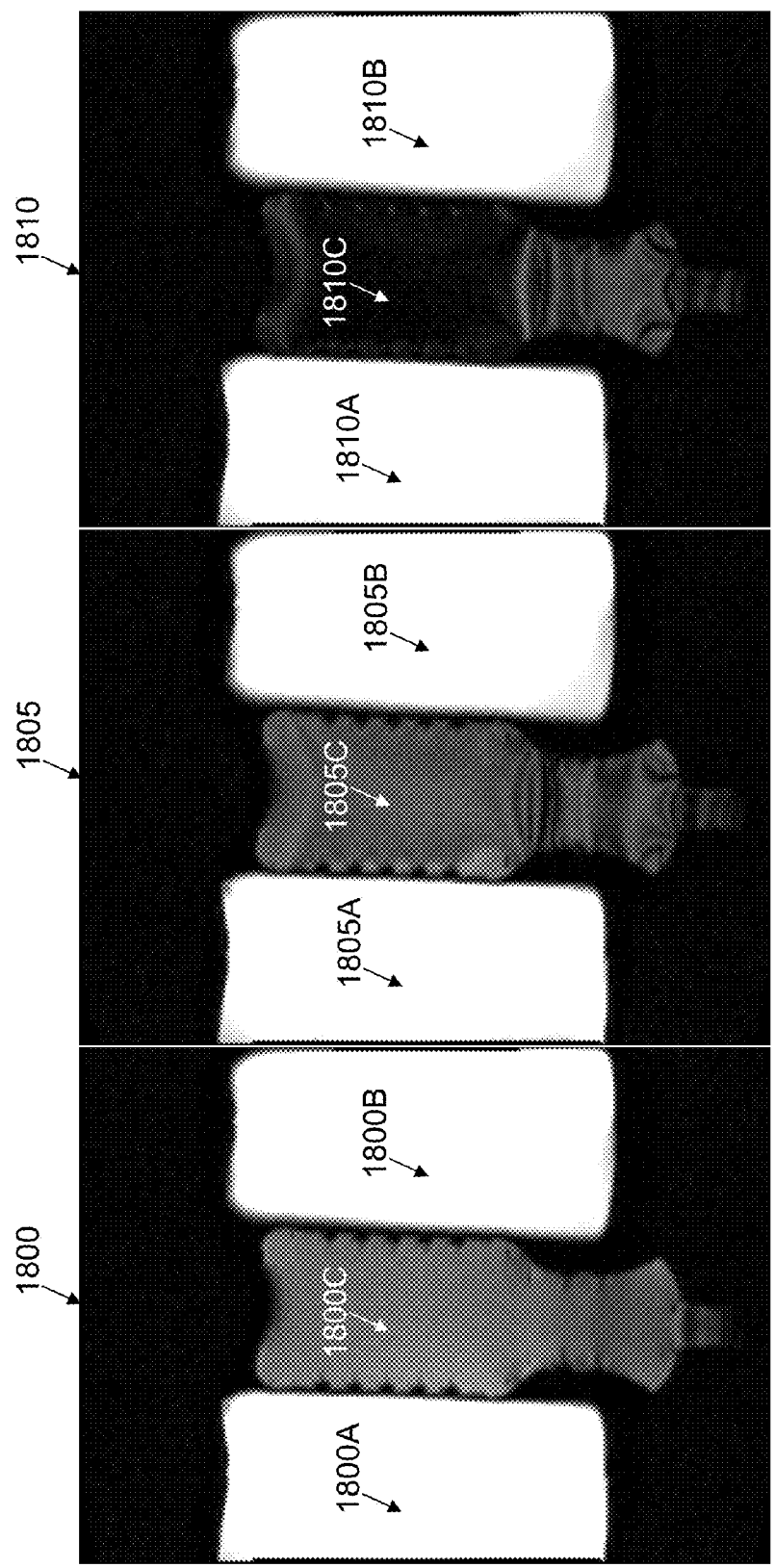
FIG. 18 shows another example using the same T2-preparation module as in FIG. 17.
Figure 19:
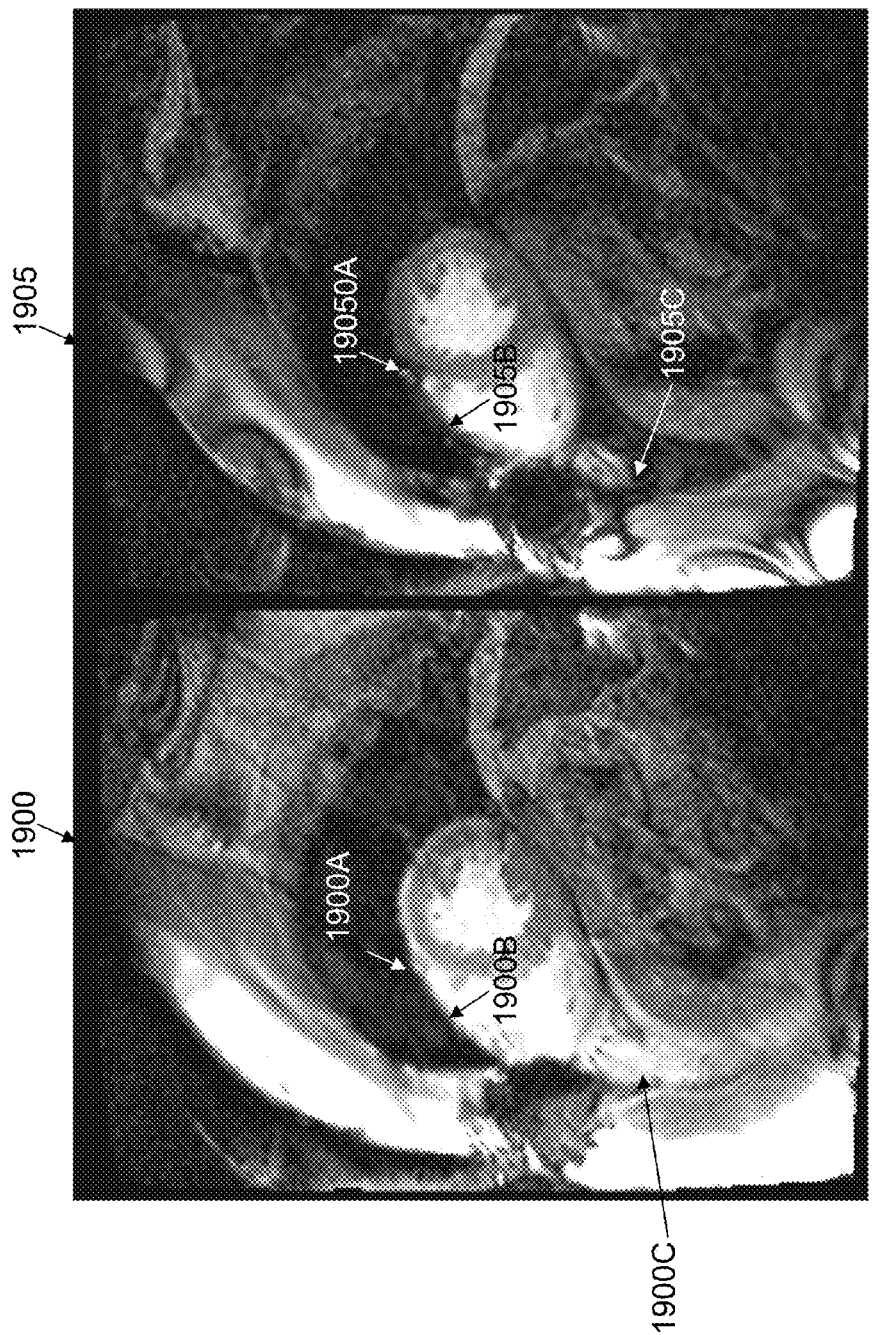
FIG. 19 shows cardiac patient images and demonstrating an example of pulse types I and II as components of the combined T2-preparation and fat inversion module according to FIGS. 5A and 5B.

FIG. 18 shows another example using the same T2-preparation module as in FIG. 17. Without T2-preparation, as shown in image 1800, fat compartment 1800C appears light grey while water compartments 1800A and 1800B appear white. With a standard T2-preparation, as shown in image 1805, fat compartment 1805C appears darker, yet grey while water compartments 1805A and 1805B again appear white. With T2-preparation integrated fat inversion incorporating the advantageous pulses, shown in image 1810, fat compartment 1810C appears completely dark while water compartments 1810A and 1810B remain white. That is, the water signal is the same for the conventional and the new T2-preparation FIG. 19 shows cardiac patient images 1900 and 1905 demonstrating an example of pulse types I and II as components of the combined T2-preparation and fat inversion module according to FIGS. 5A and 5B. This is the same module used for the phantom images of FIG. 17. Image 1900 shows an image obtained with standard T2-preparation, image 1905 shows the same slice in the same patient obtained with combined T2-preparation and fat inversion. In image 1900, regions of pericardial fat 1900A and epicardial fat (1900B, 1900C) appear bright, but in the image 1905 using the continuous composite pulses, as described herein, the same regions 1905A, 1905B, and 1905C appear dark. Myocardium has the same signal intensity on both images.

Figure 20:
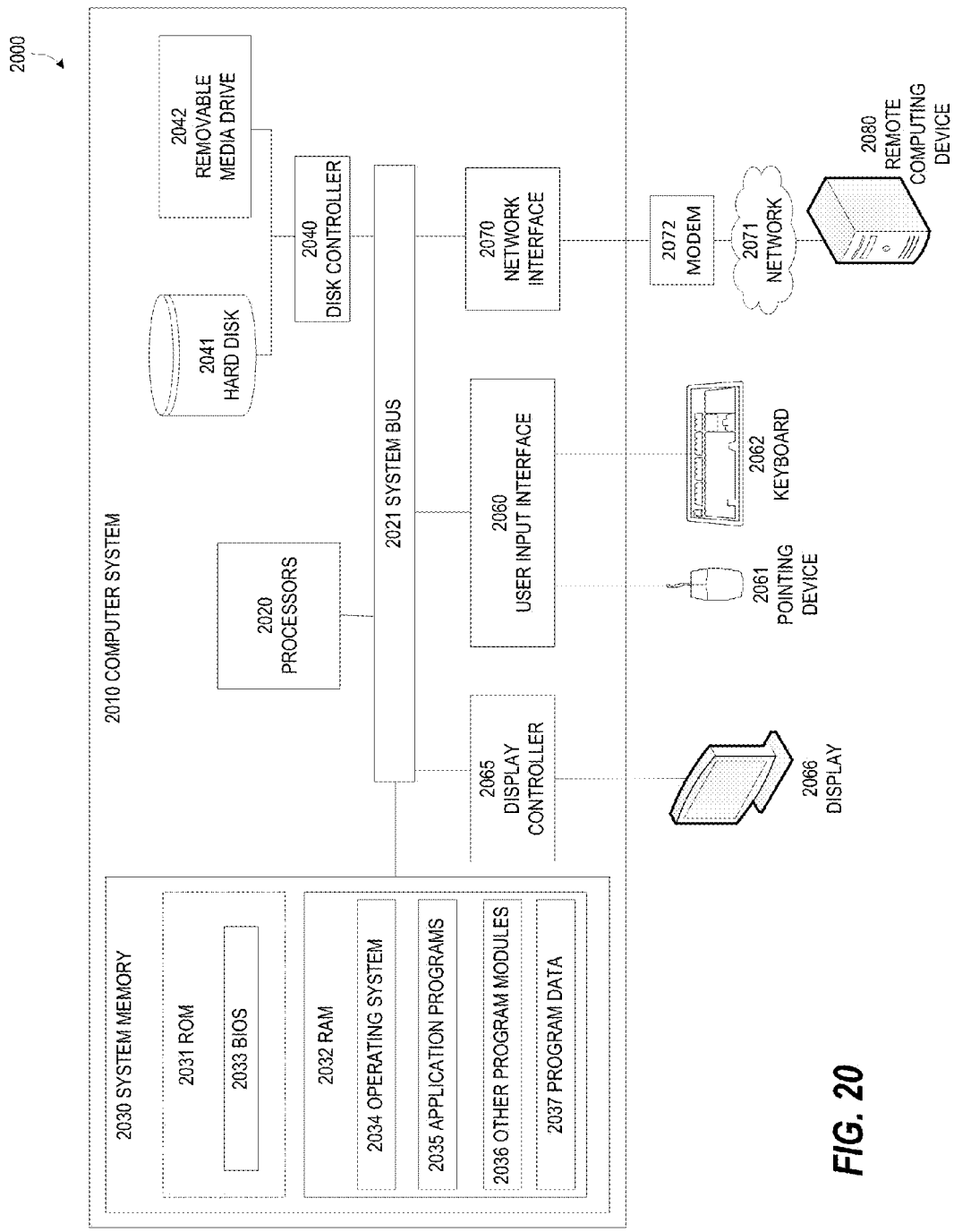
FIG. 20 illustrates an example of a computing environment within which embodiments of the invention may be implemented.

FIG. 20 illustrates an example of a computing environment 2000 within which embodiments of the invention may be implemented. Computing environment 2000 may include computer system 2010, which is one example of a general purpose computing system upon which embodiments of the invention may be implemented. Computers and computing environments, such as computer 2010 and computing environment 2000, are known to those of skill in the art and thus are described briefly here.

As shown in FIG. 20, the computer system 2010 may include a communication mechanism such as a bus 2021 or other communication mechanism for communicating information within the computer system 2010. The system 2010 further includes one or more processors 2020 coupled with the bus 2021 for processing the information. The processors 2020 may include one or more CPUs, GPUs, or any other processor known in the art.

The computer system 2010 also includes a system memory 2030 coupled to the bus 2021 for storing information and instructions to be executed by processors 2020. The system memory 2030 may include computer readable storage media in the form of volatile and/or nonvolatile memory, such as read only memory (ROM) 2031 and/or random access memory (RAM) 2032. The system memory RAM 2032 may include other dynamic storage device(s) (e.g., dynamic RAM, static RAM, and synchronous DRAM). The system memory ROM 2031 may include other static storage device(s) (e.g., programmable ROM, erasable PROM, and electrically erasable PROM). In addition, the system memory 2030 may be used for storing temporary variables or other intermediate information during the execution of instructions by the processors 2020. A basic input/output system 2033 (BIOS) containing the basic routines that help to transfer information between elements within computer system 2010, such as during start-up, may be stored in ROM 2031. RAM 2032 may contain data and/or program modules that are immediately accessible to and/or presently being operated on by the processors 2020. System memory 2030 may additionally include, for example, operating system 2034, application programs 2035, other program modules 2036 and program data 2036.

The computer system 2010 also includes a disk controller 2040 coupled to the bus 2021 to control one or more storage devices for storing information and instructions, such as a magnetic hard disk 2041 and a removable media drive 2042 (e.g., floppy disk drive, compact disc drive, tape drive, and/or solid state drive). The storage devices may be added to the computer system 2010 using an appropriate device interface (e.g., a small computer system interface (SCSI), integrated device electronics (IDE), Universal Serial Bus (USB), or FireWire).

The computer system 2010 may also include a display controller 2065 coupled to the bus 2021 to control a display or monitor 2065, such as a cathode ray tube (CRT) or liquid crystal display (LCD), for displaying information to a computer user. The computer system includes an input interface 2060 and one or more input devices, such as a keyboard 2062 and a pointing device 2061, for interacting with a computer user and providing information to the processor 2020. The pointing device 2061, for example, may be a mouse, a trackball, or a pointing stick for communicating direction information and command selections to the processor 2020 and for controlling cursor movement on the display 2066. The display 2066 may provide a touch screen interface which allows input to supplement or replace the communication of direction information and command selections by the pointing device 2061.

The computer system 2010 may perform a portion or all of the processing steps of embodiments of the invention in response to the processors 2020 executing one or more sequences of one or more instructions contained in a memory, such as the system memory 2030. Such instructions may be read into the system memory 2030 from another computer readable medium, such as a hard disk 2041 or a removable media drive 2042. The hard disk 2041 may contain one or more datastores and data files used by embodiments of the present invention. Datastore contents and data files may be encrypted to improve security. The processors 2020 may also be employed in a multi-processing arrangement to execute the one or more sequences of instructions contained in system memory 2030. In alternative embodiments, hard-wired circuitry may be used in place of or in combination with software instructions. Thus, embodiments are not limited to any specific combination of hardware circuitry and software.

As stated above, the computer system 2010 may include at least one computer readable medium or memory for holding instructions programmed according embodiments of the invention and for containing data structures, tables, records, or other data described herein. The term "computer readable medium" as used herein refers to any non-transitory, tangible medium that participates in providing instructions to the processor 2020 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 2041 or removable media drive 2042. Non-limiting examples of volatile media include dynamic memory, such as system memory 2030. Non-limiting examples of transmission media include coaxial cables, copper wire, and fiber optics, including the wires that make up the bus 2021. Transmission media may also take the form of acoustic or light waves, such as those generated during radio wave and infrared data communications.

The computing environment 2000 may further include the computer system 2020 operating in a networked environment using logical connections to one or more remote computers, such as remote computer 2080. Remote computer 2080 may be a personal computer (laptop or desktop), a mobile device, a server, a router, a network PC, a peer device or other common network node, and typically includes many or all of the elements described above relative to computer 2010. When used in a networking environment, computer 2010 may include modem 2062 for establishing communications over a network 2061, such as the Internet. Modem 2062 may be connected to system bus 2021 via user network interface 2070, or via another appropriate mechanism.

Network 2071 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 2010 and other computers (e.g., remote computing system 2080). The network 2071 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 2071.

The system and processes of the figures presented herein are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. Further, the processes and applications may, in alternative embodiments, be located on one or more (e.g., distributed) processing devices on a network linking the units of FIG. 1. Any of the functions and steps provided in the Figures may be implemented in hardware, software or a combination of both. No claim element herein is to be construed under the provisions of 35 U.S.C. 112, sixth paragraph, unless the element is expressly recited using the phrase "means for."

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for manipulating magnetic resonance signals of a first chemical species and a second chemical species, the method comprising:
   determining a time required to have spins of protons corresponding to the first chemical species acquire a phase shift of 90 degrees relative to spins of protons corresponding to second chemical species;
   defining a first pulse portion having a pulse amplitude and a first constant phase;
   defining a second pulse portion having the pulse amplitude and a second constant phase, the second constant phase being different from said first constant phase by a multiple of 90 degrees;
   generating a single continuous composite pulse comprising a concatenation of the first pulse portion and the second pulse portion, wherein the single continuous composite pulse has a duration such that a time difference between center of the first pulse portion and center of the second pulse portion corresponds to the determined time; and
   applying the single continuous composite pulse to a plurality of radio frequency coils.

2. The method of claim 1, wherein the first chemical species is fat and the second chemical species is water.

3. The method of claim 1, further comprising:
   rotating, via the single continuous composite pulse, the magnetization of the first chemical species by 90 degrees while maintaining the magnetization of the second chemical species in its original orientation.

4. The method of claim 1, further comprising:
   rotating, via the single continuous composite pulse, magnetization of the first chemical species from a longitudinal direction to a transverse plane while maintaining magnetization of the second chemical species along the longitudinal direction.

5. The method of claim 1, further comprising:
   rotating, via the single continuous composite pulse, magnetization of the first chemical species by 90 degrees while inverting magnetization of the second chemical species.

6. The method of claim 1, further comprising:
rotating, via the single continuous composite pulse, magnetization of the first chemical species from a transverse plane to a longitudinal direction while inverting the magnetization of the second chemical species along the longitudinal direction.

7. The method of claim 1, further comprising:
defining a leading pulse portion having the pulse amplitude and a leading constant phase; and
defining a trailing pulse portion having the pulse amplitude and a trailing constant phase, the leading constant phase being different from said first constant phase by a multiple of 90 degrees,
wherein the generated single continuous composite pulse further comprises the leading pulse portion preceding the concatenation of the first pulse portion and the second pulse portion and the trailing pulse portion following the concatenation of the first pulse portion and the second pulse portion.

8. The method of claim 7, wherein the leading pulse portion and the trailing pulse portion each have a duration in the generated single continuous composite pulse equal to a multiple of the determined time.

9. The method of claim 7, wherein the leading pulse portion and the trailing pulse portion each have a duration in the generated single continuous composite pulse equal to the determined time.

10. An imaging system for manipulating magnetic resonance signals of a first chemical species associated with a first resonant frequency and a second chemical species associated with a different second resonant frequency, the system comprising:
at least one RF (Radio Frequency) coil, providing a single continuous RF pulse of constant amplitude and comprising:
(a) a first constant phase in a first portion, and
(b) a second constant phase during a second portion, the second constant phase being different from said first constant phase by a multiple of 90 degrees,
wherein the single continuous RF pulse has a duration such that a time difference between a center of the first portion and a center of the second portion corresponds to a time required to have first spins of the first chemical species acquire a phase shift of 90 degrees relative to second spins of the second chemical species.

11. The system of claim 10, wherein the single continuous RF pulse performs two consecutive orthogonal spin rotations.

12. The system of claim 10, wherein the single continuous RF pulse has a total duration of twice the time required to have first spins corresponding to the first chemical species acquire a phase shift of 90 degrees relative to second spins corresponding to the second chemical species.

13. The system of claim 10, wherein the single continuous RF pulse rotates the magnetization of the first chemical species by 90 degrees while maintaining the magnetization of the second chemical species in its original orientation.

14. The system of claim 10, wherein the single continuous RF pulse rotates magnetization of the first chemical species from a longitudinal direction to a transverse plane while maintaining magnetization of the second chemical species along the longitudinal direction.

15. The system of claim 10, wherein the single continuous RF pulse rotates the magnetization of the first chemical species by 90 degrees while inverting the magnetization of the second chemical species.

16. The system of claim 10, wherein the single continuous RF pulse rotates the magnetization of the first chemical species from a transverse plane to a longitudinal direction while inverting the magnetization of the second chemical species along the longitudinal direction.

17. An article of manufacture for manipulating magnetic resonance signals of a first chemical species and a second chemical species, the article of manufacture comprising a non-transitory, tangible computer-readable medium holding computer-executable instructions for performing a method comprising:
determining a time required to have spins of protons corresponding to the first chemical species acquire a phase shift of 90 degrees relative to spins of protons corresponding to second chemical species;
defining a first pulse portion having a pulse amplitude and a first constant phase;
defining a second pulse portion having the pulse amplitude and a second constant phase, the second constant phase being different from said first constant phase by a multiple of 90 degrees;
generating a single continuous composite pulse comprising a concatenation of the first pulse portion and the second pulse portion, wherein the single continuous composite pulse has a duration such that a time difference between center of the first pulse portion and center of the second pulse portion corresponds to the determined time; and
applying the single continuous composite pulse to a plurality of radio frequency coils.

18. The article of manufacture of claim 17, wherein the method further comprises:
defining a leading pulse portion having the pulse amplitude and a leading constant phase; and
defining a trailing pulse portion having the pulse amplitude and a trailing constant phase, the leading constant phase being different from said first constant phase by a multiple of 90 degrees,
wherein the generated single continuous composite pulse further comprises the leading pulse portion preceding the concatenation of the first pulse portion and the second pulse portion and the trailing pulse portion following the concatenation of the first pulse portion and the second pulse portion.

19. The article of manufacture of claim 17, wherein the leading pulse portion and the trailing pulse portion each have a duration in the generated single continuous composite pulse equal to a multiple of the determined time.

20. The article of manufacture of claim 17, wherein the leading pulse portion and the trailing pulse portion each have a duration in the generated single continuous composite pulse which is equal to the determined time.

* * * * *